(12) United States Patent
Takayanagi et al.

(10) Patent No.: US 6,600,212 B2
(45) Date of Patent: Jul. 29, 2003

(54) SEMICONDUCTOR DEVICE AND METHOD OF FABRICATING THE SAME

(75) Inventors: Mariko Takayanagi, Kawasaki (JP); Hironobu Fukui, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/082,257

(22) Filed: Feb. 26, 2002

(65) Prior Publication Data

US 2002/0130393 A1 Sep. 19, 2002

(30) Foreign Application Priority Data

Mar. 13, 2001 (JP) .......................... 2001-069791
Oct. 29, 2001 (JP) .......................... 2001-331158

(51) Int. Cl.$^7$ ............................ H01L 31/117
(52) U.S. Cl. .................. 257/616; 257/412; 257/369; 257/392; 257/407
(58) Field of Search ................. 257/616, 369, 257/412, 407, 392, 500

(56) References Cited

U.S. PATENT DOCUMENTS

| | | | | |
|---|---|---|---|---|
| 5,952,701 A | * | 9/1999 | Bulucea et al. | 257/616 |
| 6,262,456 B1 | * | 7/2001 | Yu et al. | 257/616 |
| 2002/0113294 A1 | * | 8/2002 | Rhee et al. | 257/616 |

OTHER PUBLICATIONS

T. King, J. McVittie, K. Saraswat, Electrical Properties of Heavily Doped Polycrystalline Silicon–Germanium Films, IEEE Transactions on Electron Devices, Feb. 1994, vol. 42, No. 2, pp. 228–232.

* cited by examiner

Primary Examiner—Mark V. Prenty
(74) Attorney, Agent, or Firm—Pillsbury Winthrop LLP

(57) ABSTRACT

A semiconductor device has a semiconductor substrate, a first transistor having a first gate electrode formed of a polycrystalline silicon germanium film as formed above said semiconductor substrate, and a second transistor having a second gate electrode which is formed of a polycrystalline silicon germanium film as formed above the semiconductor substrate and which is different in concentration of germanium from the first gate electrode.

5 Claims, 20 Drawing Sheets

SEMICONDUCTOR DEVICE AND METHOD OF FABRICATING THE SAME

CROSS-REFERENCE TO RELATED APPLICATIONS

This application is based on and claims the benefit of priorities from prior Japanese Patent Applications No. 2001-69791, filed on Mar. 13, 2001, and No. 2001-331158, filed on Oct. 29, 2001, the entire contents of which are incorporated herein by reference.

BACKGROUND OF THE INVENTION

1. Field of the Invention

This invention relates to semiconductor devices with a polycrystalline silicon germanium film for use as gate electrodes, and also relates to a method of fabricating the same.

2. Description of Related Art

Recently, integrated circuit (IC) chips employing metal insulator semiconductor field effect transistors (MISFETs) are becoming thinner and thinner in gate dielectric films on the basis of scaling rules, resulting in usage of gate dielectric films with a thickness of 3 nanometers (nm) or less. With such thin gate dielectric film-based MISFETs, the capacitance of a silicon substrate and the capacitance of a gate electrode as equivalently series-coupled with respect to the capacitance of a gate dielectric film becomes more significant appreciably, which leads to unattainability of any gate capacitance increase otherwise expectable due to a decrease in gate dielectric film thickness.

A parasitic capacitance as induced due to depletion of a gate electrode made of polycrystalline silicon is determinable in value largely depending upon a concentration of active impurities residing within the polycrystalline silicon or "polysilicon": the less the active impurity concentration, the greater the parasitic capacitance value. Accordingly, it is desired that the active impurity concentration of a polysilicon gate electrode is as high as possible. However, the degree of activation of such impurities—say, impurity activation ratio—is simply determined by the solubility of impurities and thus must be limited in value. In particular, in the case of introduction of a p-type impurity into polysilicon, it is difficult to obtain any activated impurity concentration that is greater in value than possible with currently available ones.

With highly miniaturized or "microfabricated" IC elements, the presence of a need to form shallow source and drain diffusion layers results in thermal processing for impurity activation also decreasing both in temperature and in length of time period required. This also limits the impurity activation ratio of polysilicon gate electrodes. And, if the impurity activation ratio stays low then the resulting parasitic capacitance increases while at the same time disabling achievement of electrical resistivity reduction of gate electrodes. This in turn leads to an inability to obtain any required high-speed performance.

One approach proposed today to avoiding this problem is to form gate electrodes by use of a polycrystalline silicon germanium (SiGe) film that is inherently higher in impurity solubility than polysilicon. Unfortunately, recent study and research results have revealed that this approach does not come without accompanying a penalty which follows. In cases where an n-type impurity such as phosphorus (P) or the like is introduced into polycrystalline SiGe material, the resultant activation ratio becomes lower than possible with polysilicon if the Ge concentration gets higher. This is suggested from some papers; for example, 1) T. J. King et al., ED-41, p. 228 (1994) and 2) W. C. Lee et al., EDL-19, p. 247 (1998).

See FIGS. 35 and 36. These graphs indicate experimental data as presented in the above-identified two documents ("D1" and "D2"). More specifically, FIG. 35 is a graph demonstrating plots of activation ratios of boron (B) and phosphorus (P) as a function of germanium (Ge) concentration in polycrystalline SiGe whereas FIG. 36 shows plots of activated impurity concentration of B and P versus Ge concentration. Note here that these value-change curves are under the condition that thermal processing for activation was done at a temperature of 900° C. for forty minutes. It is very likely that the use of arsenide (As) yields in similar results to P. In this way, whereas p-type impurities increase in impurity activation ratio with an increase in Ge concentration within a limited range of up to approximately 40 atomic percent (atm %) of Ge concentration, n-type impurities are such that the activation ratio thereof rapidly drops down when Ge concentration goes beyond about 20 to 30 atm %. In view of this, D2 teaches that it should be required to set the Ge concentration at 20 atm % or more or less when gate electrodes of a complementary metal oxide semiconductor (CMOS) circuit are formed of a polycrystalline SiGe film.

On the contrary, in mixed or "hybrid" LSI chips with logic circuits and dynamic random access memories (DRAMs) or analog circuits integrated or "embedded" together, potentially different internal power supply voltages are ordinarily used in units of circuit regions in most cases. More specifically a plurality of types of CMOS circuits operable with multiple supply voltages are formed together on the same silicon substrate. Obviously such supply voltage-different CMOS circuits are required to employ gate dielectric films that are different in film thickness from one another. Generally the film thickness of a gate oxide film is designed so that an electrical field being applied thereto falls within a specified range of from 4 to 5 MV/cm.

A typical process of forming a plurality of kinds of gate oxide films is as follows. After having formed a thick gate oxide film on the entire surface area of a silicon substrate, this film is partially etched away to thereby form thin gate oxide films. However, forming such multiple different gate oxide films at different on-chip locations does call for execution of both resist coating process and peel-off process on or above the gate oxide films, which would result in a decrease in long-term reliability. Additionally a thicker gate oxide film must be formed through two extra oxidation steps; thus, the film thickness controllability decreases causing the resultant film to undesirably increase or decrease in thickness.

As apparent from the foregoing, the approach to fabricating a CMOS circuit having more than one gate electrode formed of a polycrystalline SiGe film suffers from a problem as to an inability to take full advantages or merits as derived from the use of a polycrystalline SiGe film, due to a difference in activation ratio between p-type and n-type impurities.

Another problem faced with LSI chips with built-in circuits operable with a plurality of different power supply voltages is that formation of gate dielectric films of different film thickness values can result in decreases in reliability and in film thickness controllability.

SUMMARY OF THE INVENTION

In accordance with one aspect of this invention, there is provided a semiconductor device which comprises a semiconductor substrate, a first transistor having a first gate electrode overlying the semiconductor substrate and being formed of a polycrystalline silicon germanium film, and a second transistor having a second gate electrode overlying the semiconductor substrate and being formed of a polycrystalline silicon germanium film different in germanium concentration from the first gate electrode.

In accordance with another aspect of the invention, there is provided a method of fabricating a semiconductor device, which comprises: depositing a polycrystalline silicon germanium film above a semiconductor substrate with a gate dielectric film interposed therebetween; patterning the polycrystalline silicon germanium film to form gate electrodes in first and second circuit regions, respectively; selectively oxidizing prior to or after execution of the patterning of the gate electrodes a surface of the polycrystalline silicon germanium film in the second circuit region to thereby increase its germanium concentration; and forming source and drain diffusion layers that are self-aligned with the gate electrodes.

DETAILED DESCRIPTION OF THE EMBODIMENTS

Embodiment 1

Figure 1:
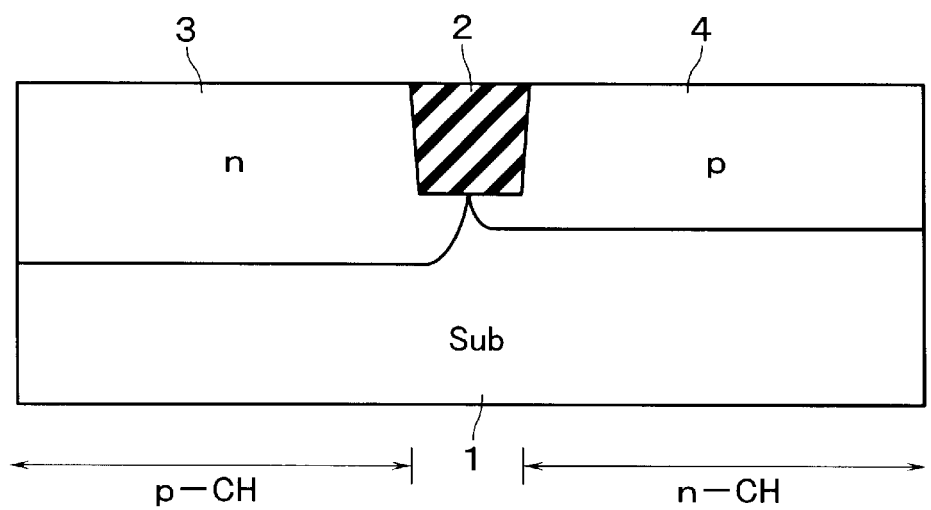
FIG. 1 is a diagram illustrating, in cross-section, one major process step in the manufacture of a semiconductor device in accordance with an embodiment of this invention, which step is for element isolation and well formation.

FIGS. 1 to 7 illustrate, in cross-section, some major process steps in the manufacture of a semiconductor device in accordance with an embodiment 1 of this invention. As shown in FIG. 1, a shallow trench isolation (STI) technique is used to form element isolation films in a top surface of a silicon substrate 1, although only one element isolation film 2 is depicted herein for illustration purposes only. This element isolation film 2 may alternatively be formed by so-called "local oxidation of silicon" (LOCOS) methods. Thereafter, while letting the silicon substrate 1 be covered or coated with a sacrificial oxide film (not shown), sequentially dope an n-type impurity and a p-type impurity by ion implantation techniques, thereby forming an n-type semiconductive well region 3 in a p-channel metal insulator semiconductor field effect transistor (MISFET) region as designed by reference character "p-CH" while forming a p-type well region 4 in an n-channel MISFET region, indicated by "n-CH" in FIG. 1.

Figure 2:
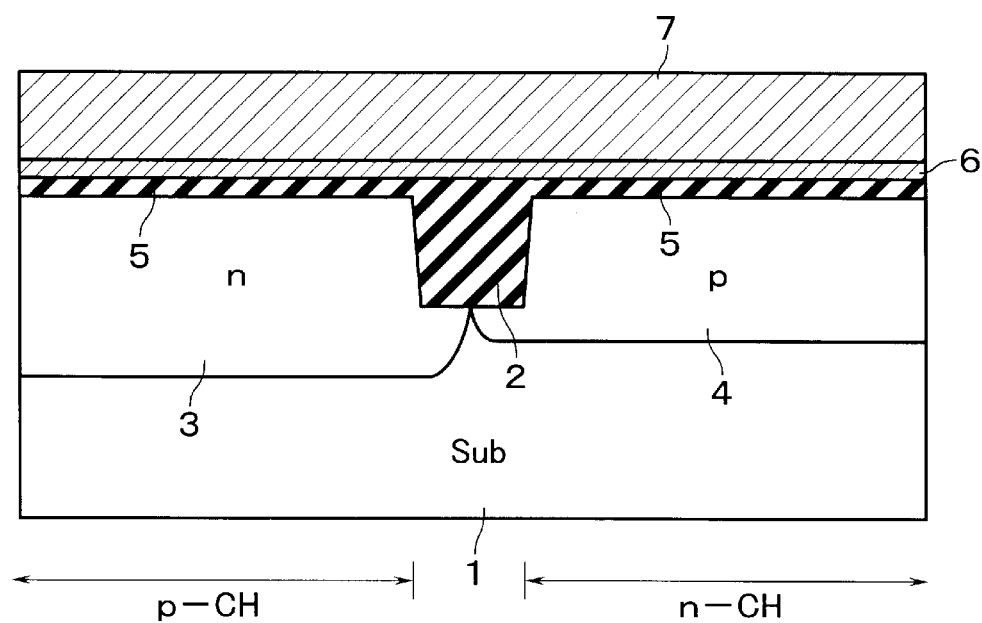
FIG. 2 is a diagram depicting, in cross-section, a polycrystalline SiGe film deposition step in the manufacture of the semiconductor device in accordance with the same embodiment of the invention.

Next, as shown in FIG. 2, after having removed or peeled off the sacrificial oxide film, form a gate dielectric film 5 to a predetermined thickness of approximately 2 nanometers (nm) in value equivalent to its functionally corresponding silicon oxide film. The gate dielectric film 5 is formed of any one of dielectric films including, but not limited to, a silicon oxide film formed through standard or ordinary thermal oxidation process, an oxynitride film formed through annealing of a thermal oxide film by NO or $N_2O$ gases, an oxynitride film obtainable by plasma nitridation of a thermal oxide film, a silicon nitride film with a thermal oxide film nitrided by $NH_3$, and a silicon nitride film deposited by chemical vapor deposition (CVD) techniques, and further a film made of oxides of a metal such as zirconium (Zr), hafnium (Hf), aluminum (Al) or the like as well as metal silicate films.

And, after having formed the gate dielectric film 5 as shown in FIG. 2, deposit a polysilicon film 6 which is as thin as 3 to 5 nm. Further, with this polysilicon film 6 as a seed, deposit a polycrystalline silicon germanium (SiGe) film 7 to a thickness of 200 nm, or more or less. Practically the polycrystalline SiGe film 7 is formed through deposition by CVD process using a mixture gas of $SiH_4$ and $GeH_4$ while letting a concentration of Ge be set at 20 to 30 atomic percent (atm %). Although the polysilicon film 6 will possibly be omitted in some cases, the presence of this film makes it possible to achieve successful deposition of the polycrystalline SiGe film 7 with increased surface flatness or planarity.

Figure 3:
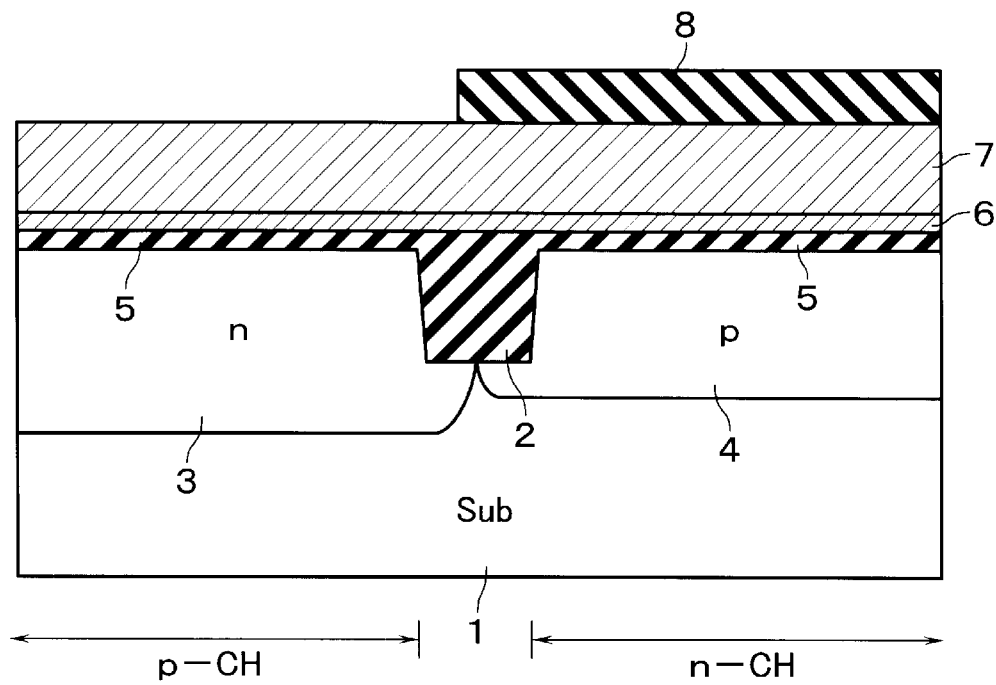
FIG. 3 is a diagram showing in cross-section a selective oxidation-use mask formation process step in the same embodiment.

Thereafter, chemically vapor-deposit on the polycrystalline SiGe film 7 a silicon nitride film 8 with a thickness of about 10 nm. As shown in FIG. 3, let this silicon nitride film 8 undergo patterning process by reactive ion etching (RIE) techniques or alternatively wet etch methods using a heated or "hot" phosphoric acid solution in a manner such that its selected portion resides only within the n-channel MISFET region "n-CH."

Figure 4:
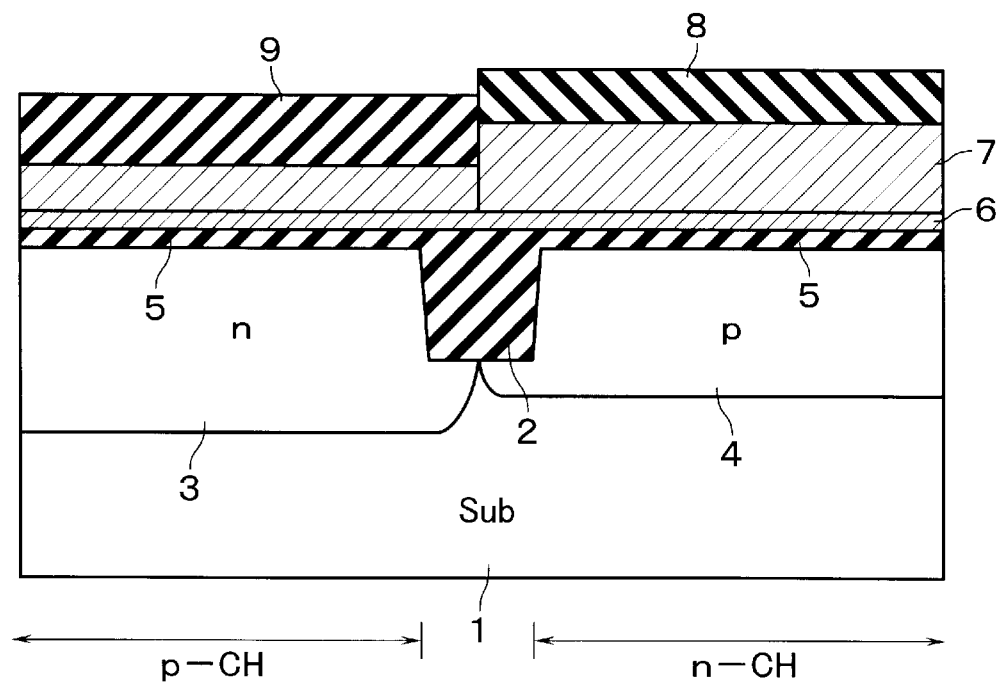
FIG. 4 is a diagram showing in cross-section a step of selective oxidation of the polycrystalline SiGe film in the same embodiment.

And after having peeled off a resist film or layer overlying the silicon nitride film 8, perform thermal oxidation preferably at a temperature of about 900° C. Whereby, an oxide film 9 is formed on an "exposed" surface portion of the polycrystalline SiGe film 7 within the p-channel MISFET region "p-CH" as shown in FIG. 4. At this time the oxidation is done under a specific condition which oxidizes silicon (Si) alone while letting Ge hardly be oxidized or "non-oxidized"—practically, at temperatures of 700° C. or higher. Additionally the oxidation is done in such a way that the polycrystalline SiGe film 7 measures about 120 nm in the residual thickness thereof. This thermal oxidation forces non-oxidized Ge to diffuse into the resultant thickness-reduced or "thinned" polycrystalline SiGe film 7 within the p-channel MISFET region p-CH and then undergo condensation, resulting in the Ge concentration of polycrystalline SiGe film 7 becoming higher than that of the n-channel MISFET region n-CH to the extent that it is at 30 atm % or greater. Practically the Ge concentration of polycrystalline SiGe film 7 is almost equal in value to an initial concentration multiplied by a ratio of an initial film thickness of SiGe layer to residual film thickness. In the case of this embodiment, it falls within a range of from about 40 to 50 atm %.

Figure 5:
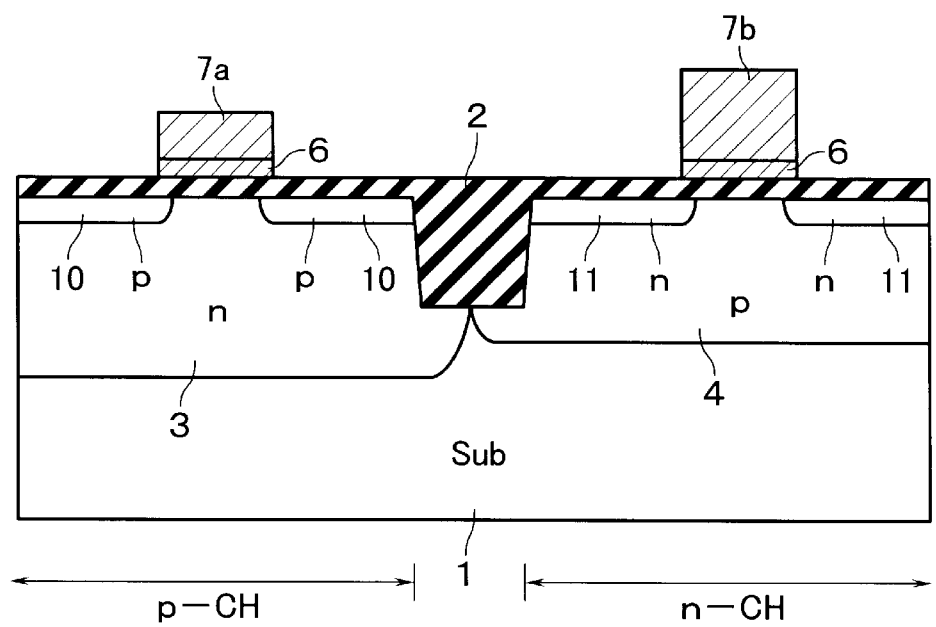
FIG. 5 illustrates in cross-section a gate electrode patterning process step and a step of forming lightly-doped source/drain diffusion layers of the device in the same embodiment.

Thereafter, effectuate wet etching to remove away the silicon oxide film 9 and silicon nitride film 8. Then use standard lithography and RIE techniques to pattern the polycrystalline SiGe film 7 and polysilicon film 6 to thereby form gate electrodes 7a, 7b of respective MISFETs along with on-chip lead wires associated therewith as shown in FIG. 5. Here, the gate electrodes 7a, 7b in the n-channel MISFET region n-CH and p-channel MISFET region p-CH are patterned simultaneously. This simultaneous gate patterning is attainable due to the fact that the SiGe layer with reduced film thickness on the p-channel side is high in Ge concentration causing the etching rate to stay low irrespective of the presence of a film thickness difference whereby no appreciable differences take place at the termination time point of etch process. However, in general cases where a film thickness difference is present, a difference must appear in length of a time as taken up to completion of etch process—in view of this, the lithography and RIE may be done with respect to the p-channel MISFET region p-CH and n-channel MISFET region n-CH in a way independent of each other.

Thereafter, form a post oxide film (not shown) with a thickness of about 2 nm; then as shown in FIG. 5, sequentially dope chosen impurities or "dopants"—here, boron (B) and arsenide (As)—by ion implantation methods into respective MISFET regions with the gate electrodes 7a, 7b used as a mask pattern, thereby forming a pair of shallow p-type diffusion layers 10 of low concentration for later use as source and drain regions along with a pair of lightly-doped n-type source/drain diffusion layers 11. After having formed these diffusion layers, perform thermal processing such as rapid thermal anneal (RTA) or the like, thus making such doped impurities active—say, activating the dopants.

Figure 6:
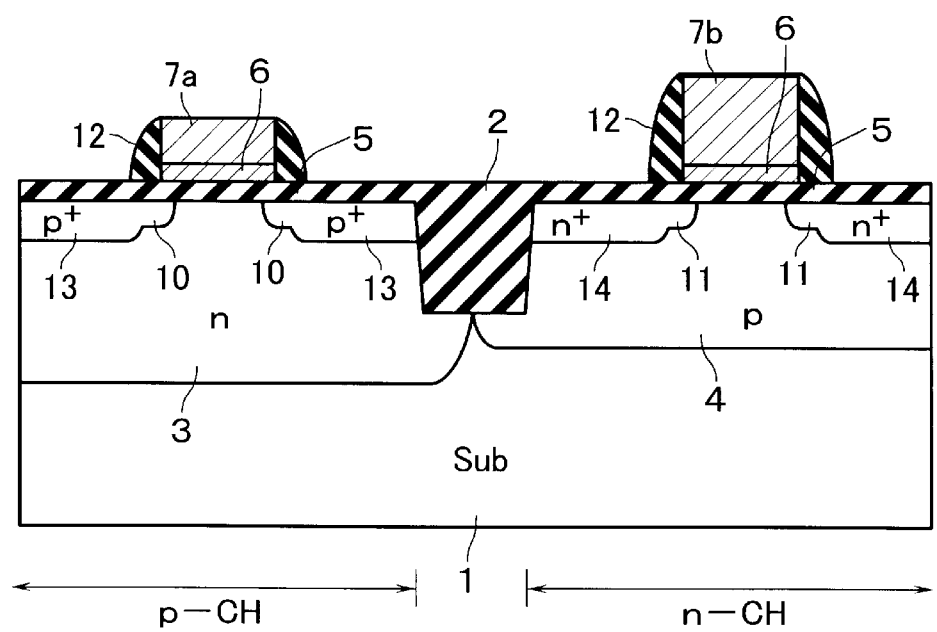
FIG. 6 depicts in cross-section a sidewall dielectric film formation step and heavily-doped source/drain diffusion layer fabrication step in the same embodiment.

Next, deposit a multilayer film which consists essentially of a silicon oxide film (with a thickness of 5 nm) and a silicon nitride film (15-nm thick) and then apply thereto RIE etch-back processing, thus forming sidewall dielectric films 12 on the lateral walls of respective gate electrodes 7a, 7b as shown in FIG. 6. And, with both the gate electrodes 7a, 7b and the sidewall dielectric films 12 as a mask structure, perform ion-implantation of boron (B) and arsenide (As) or phosphorus (P) sequentially into respective MISFET regions to thereby form a pair of deep heavily-doped p ($p^+$) type source/drain diffusion layers 13 and also deep heavily-doped n ($n^+$) type source/drain diffusion layers 14. These diffusion layers 13, 14 are greater both in depth and in impurity concentration than the above-noted layers 10–11. At this time the impurities are doped or implanted into the gate electrode 7a, 7b of each MISFET region also. After having formed these diffusion layers, perform thermal processing such as RTA or else, thus activating the impurities doped.

Figure 7:
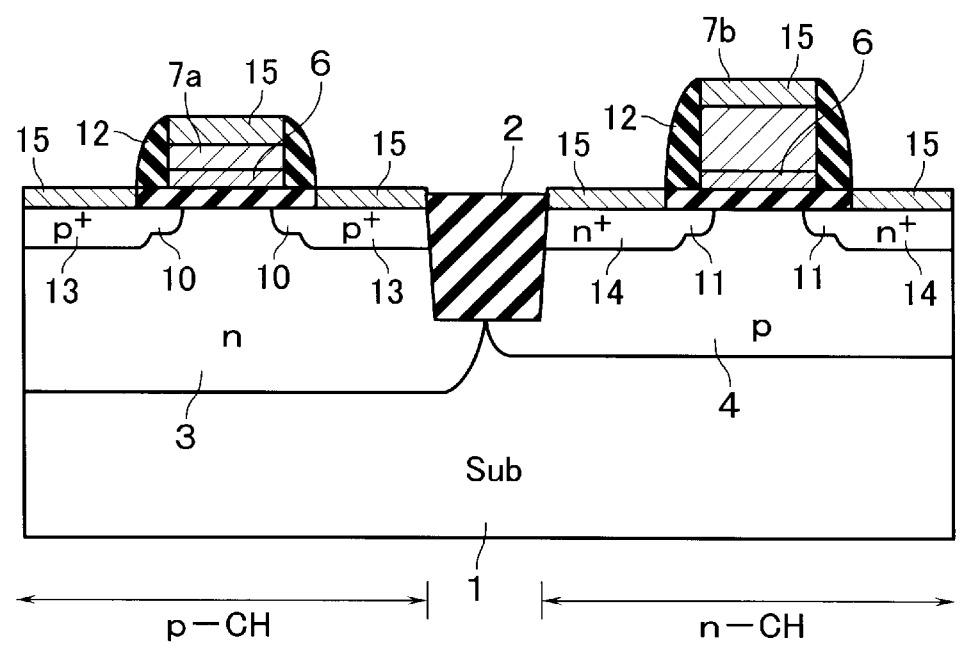
FIG. 7 shows a silicide film formation step in the same embodiment.

And, after having effectuated wet etching to remove residual oxide film components on or above surfaces of the gate electrodes 7a, 7b and source/drain diffusion layers 13, 14, fabricate a film made of nickel (Ni) by sputtering. And, execute thermal processing at a temperature of 400° C. for 20 seconds, thereby forming a Ni silicide film 15 on the top surfaces of gate electrodes 7a, 7b and source/drain diffusion layers 13–14 as shown in FIG. 7.

Thereafter, deposit more than one interlayer dielectric (ILD) film for formation of a pattern of on-chip metal leads, although not specifically depicted here.

In accordance with this embodiment discussed above, it is possible to optimize the impurity activation ratio of the polycrystalline SiGe film-based gate electrodes in a way pursuant to the circuit regions. With this embodiment, the SiGe gate electrode 7a of p-channel MISFET region p-CH is specifically arranged to be higher in Ge concentration than the SiGe gate electrode 7b in the n-channel MISFET region n-CH. Practically the Ge concentration of n-channel MISFET gate electrode 7b is designed to measure about 20 to 30 atm % whereas the Ge concentration of p-channel MISFET gate electrode 7a is greater than or equal to 30 atm %. With such unique value settings, it is possible to permit the both p- and n-channel MISFETs to measure $1 \times 10^{20}/cm^3$ in activated impurity concentration of the gate electrodes thereof even when thermal processing conditions are a little varied. This in turn makes it possible to obtain the gate electrodes that are less in parasitic capacitance and low in electrical resistivity.

In particular, the Ge concentration of the p-channel MISFET gate electrode 7a is preferably set so that it falls within a range of from 40 to 50 atm %. As apparent from viewing a graph of FIG. 36, if the Ge concentration is made higher to stay at this level then the resulting activated boron concentration goes far beyond $10^{20}/cm^3$. In addition, experimentation as conducted by the inventors as named herein has revealed the fact that there is a specific relationship between the gate electrode's activated impurity concentration and the thickness of a depletion layer at gate electrode as shown in FIG. 37. From the foregoing, it has been affirmed that letting the p-channel MISFET gate electrode's Ge concentration range from 40 to 50 atm % makes it possible to increase the resultant activated impurity concentration up to sufficiently high levels, which in turn enables the gate electrode of interest to noticeably decrease in depletion layer thickness at a level of about 0.1 $\mu$m or less in equivalent value of its functionally corresponding silicon oxide film thickness.

Another advantage of the fabrication method embodying the invention is that the gate electrode of the p-channel MISFET region is made higher in Ge concentration by selective oxidation of the polycrystalline SiGe film as deposited above an entire surface of the silicon substrate while at the same time reducing complexities in the fabrication processes required.

It should be noted that although this embodiment is illustratively arranged so that impurity introduction of the SiGe gate electrodes is done simultaneously during formation of the deep heavily-doped source/drain diffusion layers, it is modifiable so that p- and n-type impurities are introduced into respective MISFET regions independently immediately after having deposited the polycrystalline SiGe film. The impurities thus doped or implanted are expected at later steps to experience an increased number of thermal processes; thus, the impurity activation of SiGe gate electrodes is to be further accelerated.

Embodiment 2

Although in the above embodiment nickel (Ni) silicide films are formed on the surfaces of the gate electrodes and source/drain diffusion layers, a problem can arise in case cobalt (Co) silicide films are formed. This can be said because while Ni and Ge are inherently good in chemistry or "congeniality" with each other to thereby offer a capability to form low-resistivity Ni silicide films through reaction of Ni and SiGe, letting Co react with SiGe would result in creation of segregation of Ge, thus making it impossible to obtain any low-resistivity silicides. It has been reported that formation of a Co silicide on or above polycrystalline SiGe results in an increase in sheet resistivity by about one order of magnitude when compared to the case of forming a Co silicide film on or above a polysilicon gate.

With this point taken into consideration, an embodiment that enables facilitation of resistivity reduction of Co silicide film-based SiGe gate electrodes will next be explained with reference to FIGS. 8 to 16 below.

Figure 8:
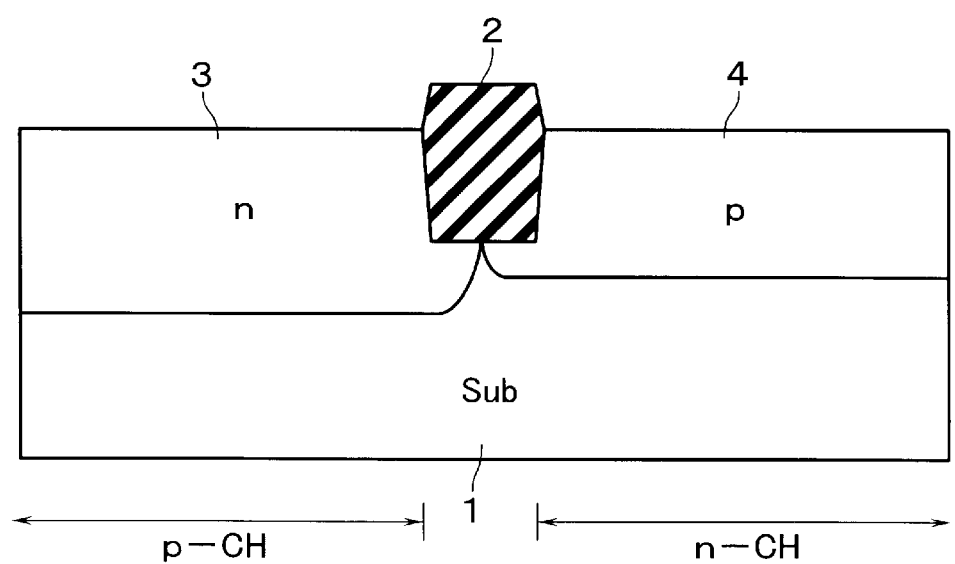
FIG. 8 is a diagram depicting in cross-section an element isolation/well formation step in the manufacture of a semiconductor device in accordance with another embodiment of this invention.

First, as shown in FIG. 8, fabricate in a surface portion of a silicon substrate 1 an element isolation dielectric film 2 by STI methods or other similar suitable techniques. The element isolation dielectric film 2 may alternatively be formed by LOCOS methods. Thereafter, let the silicon substrate 1 be doped with a chosen n-type impurity and then a p-type impurity sequentially, thereby forming an n-type well layer 3 in a p-channel MISFET region p-CH and also a p-type well 4 in n-channel MISFET region n-CH.

Figure 9:
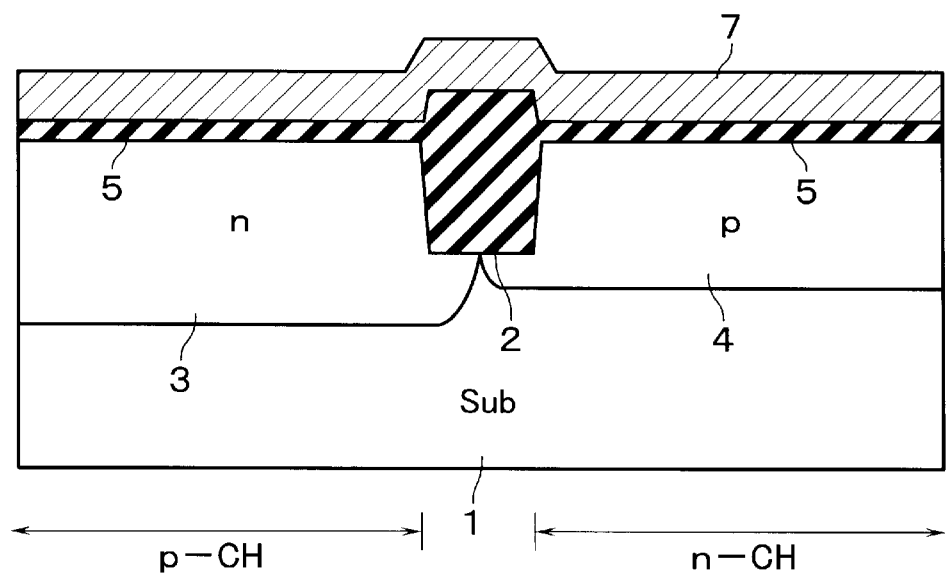
FIG. 9 is a sectional view at a polycrystalline SiGe film deposition step in the same embodiment.

Then, as shown in FIG. 9, form a gate dielectric film 5 with a predefined thickness of about 2 nm, which is an equivalent value after numerical conversion to the film thickness of its functionally corresponding silicon oxide film. The gate dielectric film 5 is formed by standard or ordinary thermal oxidation techniques, although it may alternatively be formed by other methods such as the one as explained in conjunction with the previous embodiment stated supra. Further, as shown in FIG. 9, deposit on the gate dielectric film 5 a polycrystalline SiGe film 7 to a thickness of about 200 nm. In a similar way to that of the previous embodiment, the polycrystalline SiGe film 7 is deposited by CVD using a mixture gas of $SiH_4$ and $GeH_4$. Let the Ge concentration in this case fall within a range of 20 to 30 atm % as measured on the n-channel MISFET side.

Figure 10:
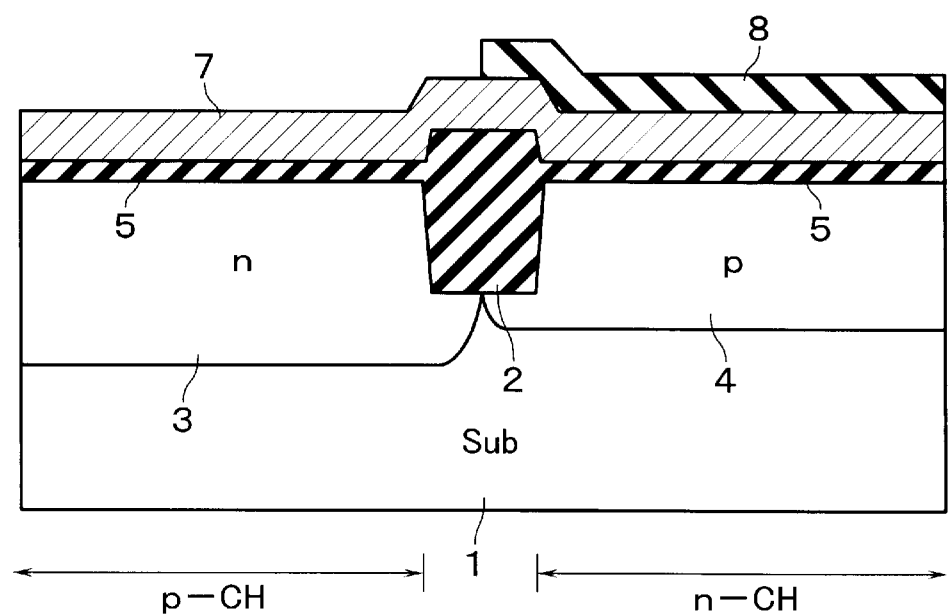
FIG. 10 shows a step of forming a mask used for selective oxidation of the polycrystalline SiGe film in the same embodiment.

Thereafter, as shown in FIG. 10, perform CVD processing to deposit on the polycrystalline SiGe film 7 a silicon nitride film 8 with a thickness of about 10 nm, which is then subjected to lithography and RIE processing or alternatively to wet etching using hot phosphoric acid, thus patterning it in such a manner that its portion resides only in the n-channel MISFET region n-CH.

Figure 11:
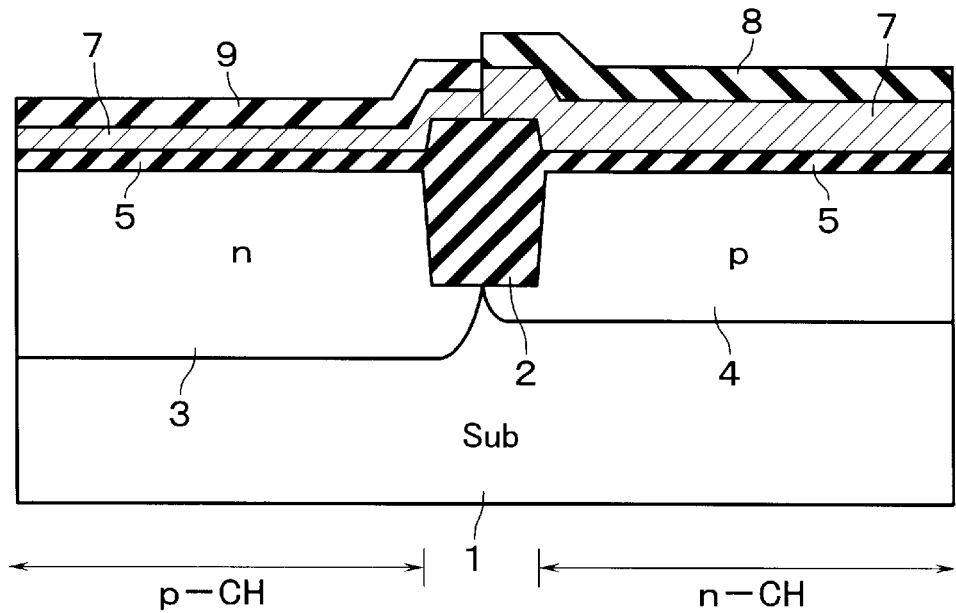
FIG. 11 shows a step of selective oxidation of the polycrystalline SiGe film in the same embodiment.

And after having removed off a resist used, perform thermal oxidation at a prespecified temperature, preferably about 900° C., thus forming an oxide film 9 on a top surface of polycrystalline SiGe film 7 as shown in FIG. 11. As in the previous embodiment, this thermal oxidation causes non-oxidized Ge to diffuse into the thinned polycrystalline SiGe film 7 within the p-channel MISFET region p-CH and then undergo condensation, resulting in the Ge concentration of polycrystalline SiGe film 7 becoming higher than that of the n-channel MISFET region n-CH—typically, at 30 atm % or more. Practically with this embodiment, the Ge concentration ranges in value from 40 to 50 atm %.

Figure 12:
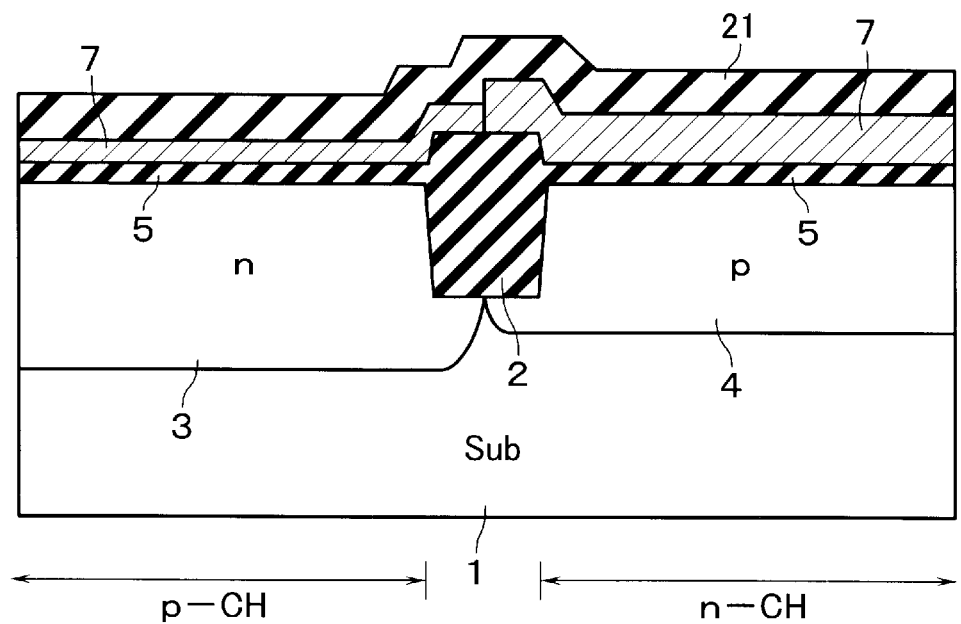
FIG. 12 shows a dielectric cap film deposition step in the embodiment.
Figure 13:
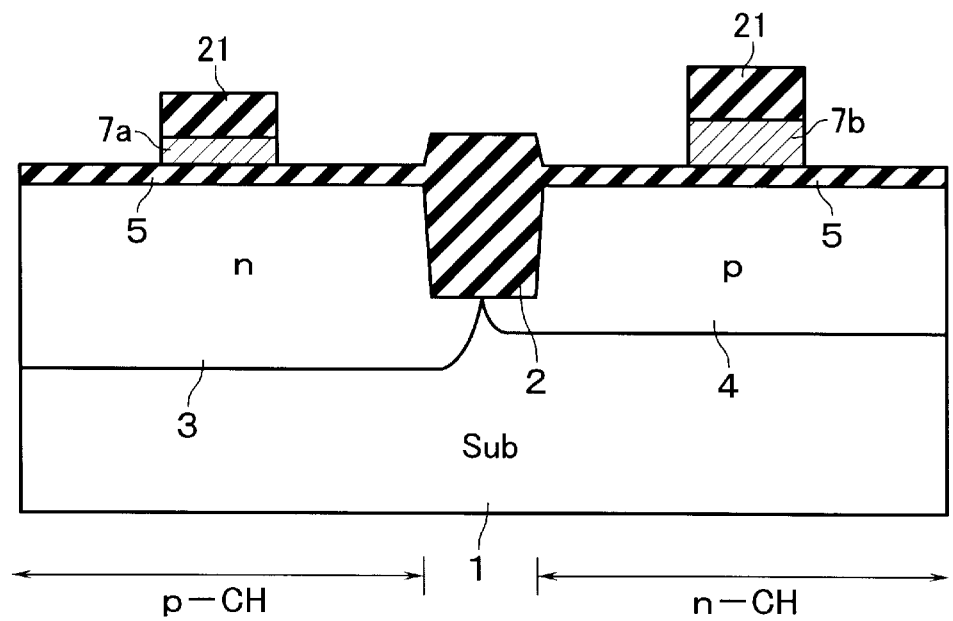
FIG. 13 shows a gate electrode patterning step in the embodiment.
Figure 14:
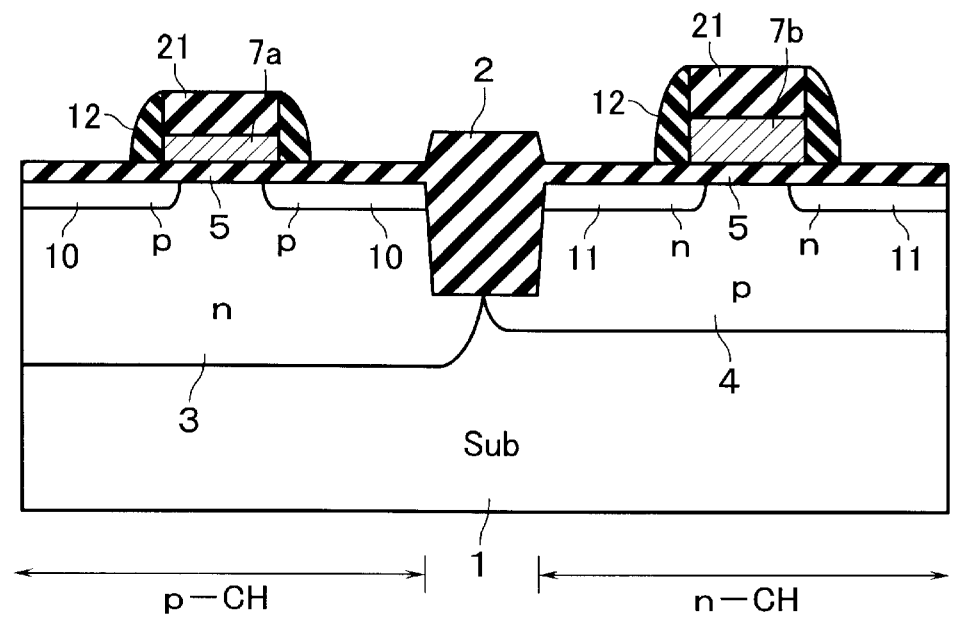
FIG. 14 shows a lightly-doped source/drain diffusion layer formation step and sidewall dielectric film formation step in the embodiment.

Thereafter remove the oxide film 9 and silicon nitride film 8 by wet etching. Its following process to be done thereafter is different from that in the previous embodiment. More specifically as shown in FIG. 12, deposit a dielectric film 21 for use as a cap layer that covers an entire surface of the resultant device structure. This dielectric cap film 21 may be a silicon oxide film as formed by low-pressure CVD techniques. And pattern the dielectric cap film 21 and its underlying polycrystalline SiGe film 7 through lithography and RIE processes, thus forming gate electrodes 7a, 7b in respective MISFET regions along with their associated on-chip leads as shown in FIG. 13. Here, the both gate electrodes 7a, 7b are patterned at a time although these may alternatively be patterned by separate lithography and etching independently of each other.

Next, with the gate electrodes 7a, 7b coated with the patterned dielectric cap films 21 being used as a mask structure, sequentially dope boron (B) and arsenide (As) by ion implantation into respective MISFET regions, thereby to form a pair of shallow lightly-doped p-type source/drain diffusion layers 10 and another pair of shallow lightly-doped n-type source/drain diffusion layers 11. After having formed these diffusion layers, perform thermal processing such as RTA or else for activation of the impurities doped. Thereafter, form sidewall dielectric films 12 on the lateral walls of gate electrodes 7a, 7b. The sidewall dielectric films 12 are different in constituent material from the dielectric cap films 21. An example is that if one of the films 12, 21 is made of silicon oxide then use silicon nitride for the other.

Figure 15:
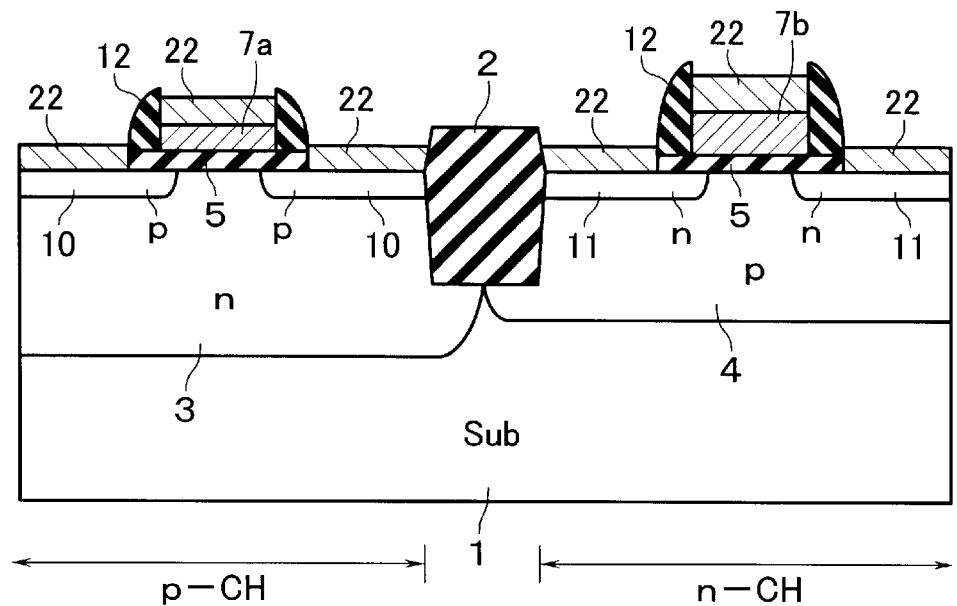
FIG. 15 shows a silicon layer selective growth step in the embodiment.

Thereafter etch away residual oxide film components on the source/drain diffusion regions and also the cap films 21 on the gate electrodes; then, let a silicon layer 22 epitaxially grow selectively on top surface portions of the gate electrodes 7a, 7b and source/drain diffusion layers 10–11 as shown in FIG. 15. Preferably the silicon layer 22 has its thickness less than or equal to that of the prior etched dielectric cap film 21 and simultaneously has its top surface lower in level than the above-stated element isolation dielectric film 2's top surface, which is "projected" to overlie the substrate 1. With such an arrangement, it is possible to avoid any unwanted electrical shortcircuiting between respective silicon layer segments 22 on gate electrodes 7a, 7b and silicon layer segments 22 on source/drain diffusion layers 10–11 while at the same time precluding electrical shorting between neighboring silicon layers 22 with an element isolation region laterally interposed therebetween. Additionally the silicon layer 22 is designed so that its thickness is greater than or equal to the requisite thickness of a silicide film to be formed at a later step. With such settings, when employing a Co film for silicidation, it is possible to prevent or at least greatly suppress any direct reaction between such Co film and the polycrystalline SiGe film 7.

Thereafter, with the gate electrodes 7a–7b and sidewall dielectric films 12 as a mask, sequentially dope boron (B) and arsenide (As) or phosphorus (P) into respective MISFET regions by ion implantation methods, forming a pair of heavily-doped p ($p^+$) type source/drain diffusion layers 13 along with a pair of $n^+$-type source/drain diffusion layers 14, which are deeper than the above-noted diffusion layers 10–11. After having formed these diffusion layers, perform thermal processing such as RTA or else to thereby activate the impurities implanted.

Figure 16:
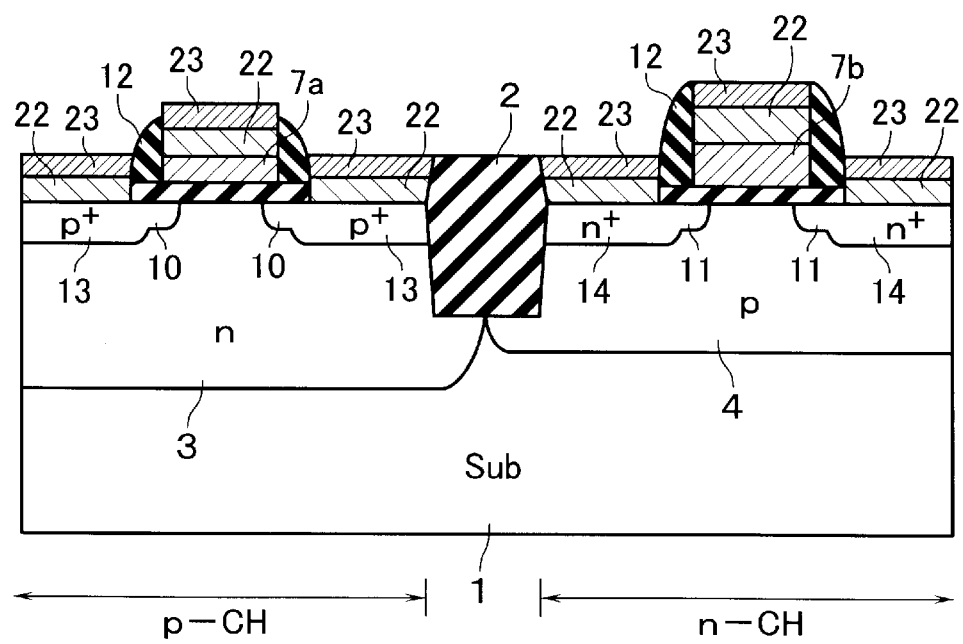
FIG. 16 shows a heavily-doped source/drain diffusion layer formation step and silicide film formation step in the embodiment.

Then fabricate a Co film by sputtering and next apply thermal processing thereto at a temperature of about 400° C. for 20 seconds, thus forming a Co silicide film 23 which consists of its portions or segments residing on the surfaces of gate electrodes 7a–7b and source/drain diffusion layers 13–14 as shown in FIG. 16. Although not specifically depicted, the resultant device structure is thereafter subject to deposition of more than one ILD film and then formation of a pattern of metallic on-chip leads.

With this embodiment also, similar results to the previous embodiment are obtainable by optimization of the impurity activation ratio of the polycrystalline SiGe film-based gate electrodes in a way conformity with circuit regions. Very importantly, in the case of this embodiment, the Co silicide films are formed through selective epitaxial growth of silicon on the gate electrodes and source/drain diffusion layers. This makes it possible to fabricate any intended silicide film while avoiding reaction between the polycrystalline SiGe film and Co at the gate electrodes, which in turn enables achievement of low-resistivity gate electrodes.

Embodiment 3

In the above-stated embodiments 1 and 2, the source/drain diffusion layers are such that shallow diffusion layers (so-called the source/drain extension regions) 10, 11 each in contact with a transistor channel region associated therewith are first formed while letting deep, heavily-doped diffusion layers 13–14 be formed lastly. With such fabrication process, thermal processing must be additionally required after formation of the extension regions 10–11, which causes extension regions 10–11 to be readily changeable in diffusion depth, thus making it difficult to accurately control diffusion depth values. Especially the extension regions 10–11 as included in the source/drain diffusion layers greatly affect occurrence of the so-called "short-channel" effects or the like; thus, it will be desired to control the diffusion depth values thereof with maximized accuracies.

Figure 17:
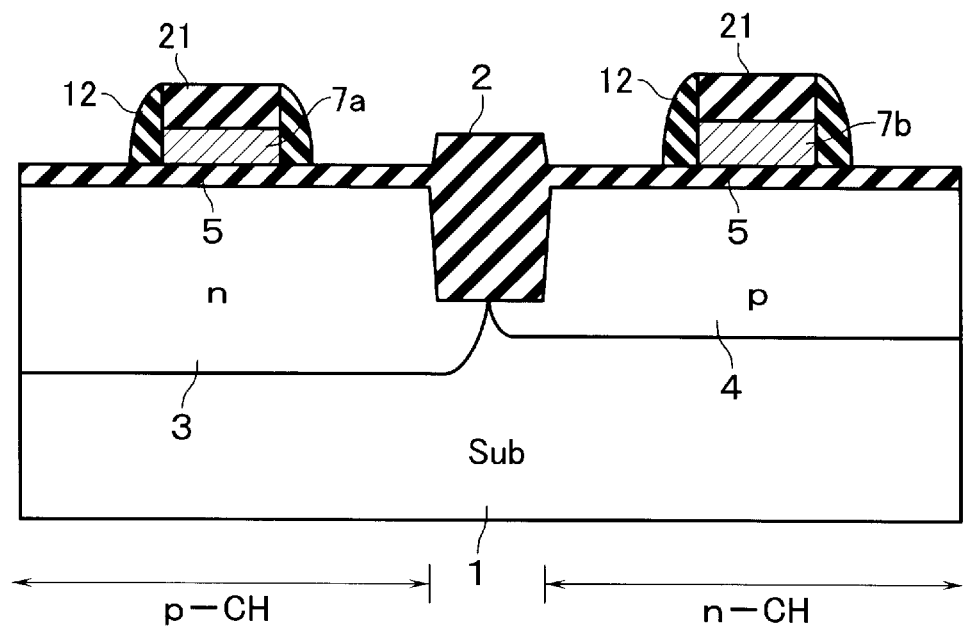
FIG. 17 is a diagram illustrating, in cross-section, one major process step in the manufacture of a semiconductor device in accordance with still another embodiment of this invention, i.e., at a gate electrode sidewall dielectric film formation step.
Figure 18:
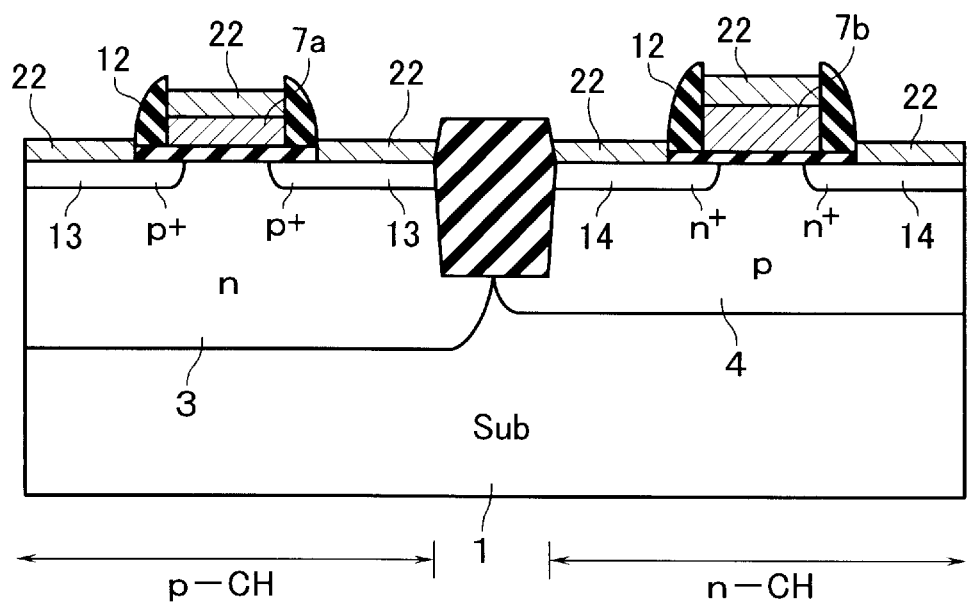
FIG. 18 is a diagram depicting in cross-section a silicon layer selective growth step and heavily-doped source/drain diffusion layer formation step in the same embodiment.

An embodiment coping with this issue will next be discussed with reference to FIGS. 17–20, which is specifically arranged so that the step of ion implantation relative to the extension regions of source/drain diffusion layers 10–11 and that of high-concentration regions 13–14 are revered in order of sequence for effectuation. Assume that the process steps shown in FIGS. 8 to 13 are the same as corresponding ones of the previous embodiment 2. After having formed the patterned gate electrodes with each being covered or coated with a dielectric cap film 21 as shown in FIG. 13, form sidewall dielectric films 12 residing on the lateral walls of these gate electrodes respectively as shown in FIG. 17. Thereafter, as shown in FIG. 18, etch away oxide film components overlying the sidewall dielectric films 21 and the source/drain diffusion layers; then, let a silicon layer 22 epitaxially grow selectively on gate electrodes 7a–7b and also in source/drain formation regions. Subsequently perform ion implantation of B and P or As into respective MISFET regions to thereby form p-type source/drain diffusion layers 13 and n-type source/drain diffusion layers 14.

Figure 19:
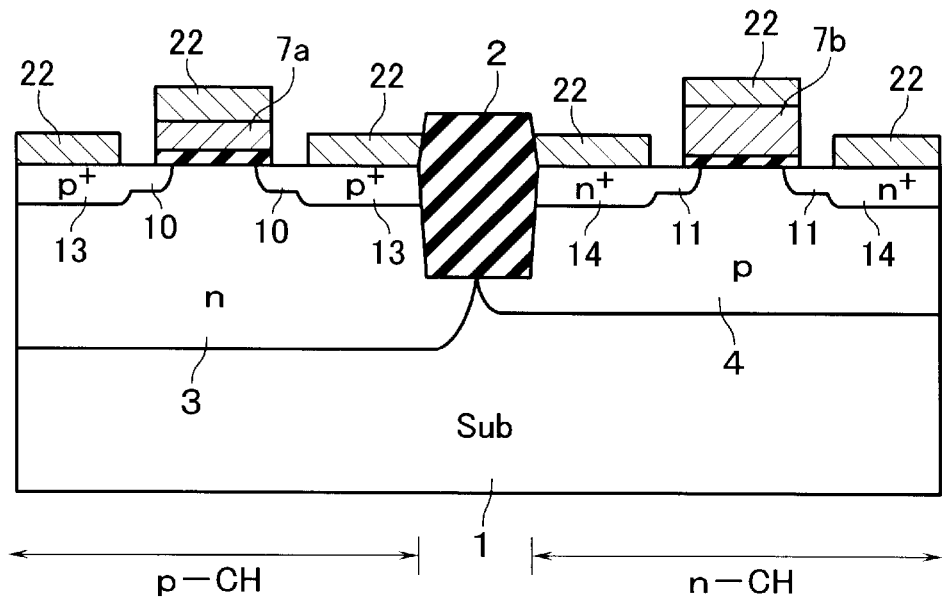
FIG. 19 shows in cross-section a lightly-doped source/drain diffusion layer formation step in the same embodiment.
Figure 20:
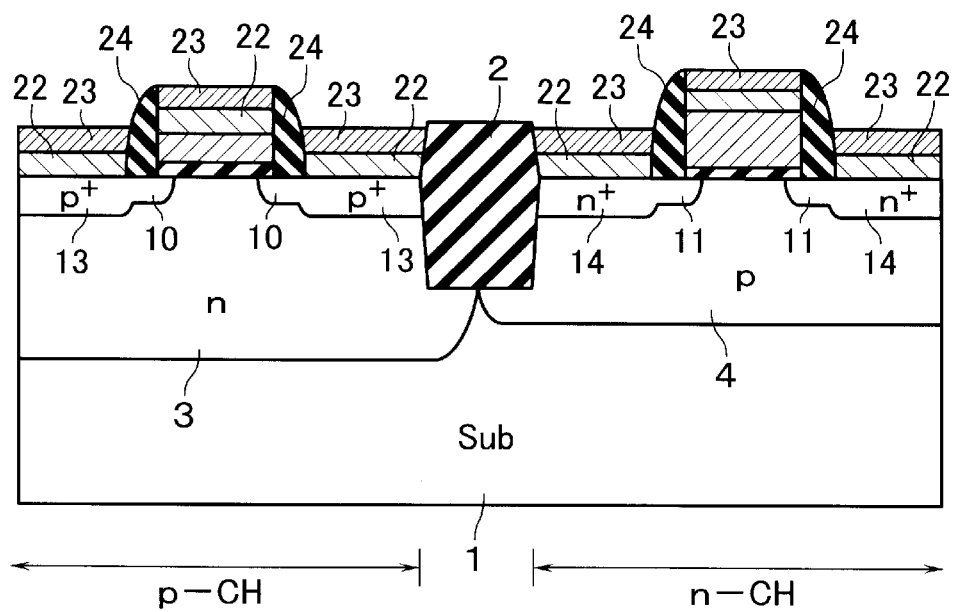
FIG. 20 shows a silicide film formation step in the embodiment.

Thereafter as shown in FIG. 19, etch away the sidewall dielectric films 12; then, perform ion implantation of B and P or As into respective MISFET regions with the gate electrodes 7a–7b as a mask structure, thus forming shallow lightly-doped p-type source/drain diffusion layers 10 and shallow lightly-doped n-type source/drain diffusion layers 11.

Thereafter as shown in FIG. 20, again form sidewall dielectric films 24 on the lateral gate walls and then form a Co silicide film 23 on top surfaces of the gate electrodes 7a–7b and source/drain diffusion layers 13–14 through similar processes to those in the embodiment 2 stated supra.

With this embodiment also, similar results to those of the previous embodiment are obtainable by optimization of the impurity activation ratio of the polycrystalline SiGe film-based gate electrodes in a way pursuant to circuit regions. Another advantage of this embodiment lies in an ability to accurately set diffusion depths of the diffusion layers 10–11 for use as source/drain extension regions because of the fact that high-temperature thermal processing is no longer required after having formed such diffusion layers 10–11. This will be preferable for suppression of short-channel effects in cases where on-chip circuit elements are highly scaled down in size or miniaturized by advanced semiconductor microfabrication technologies.

Embodiment 4

The embodiments stated above are such that the gate electrode patterning process comes after selective oxidation of the polycrystalline SiGe film 7. In this case, the gate electrode thickness being etched is different between the n-channel MISFET and p-channel MISFET. This will possibly result, when these are etched simultaneously, in unwanted etching of substrate regions due to overetching on the p-channel side or, alternatively, result in any intended etching treatment failing to be completed on the n-channel side in the event that etching conditions are determined to establish optimal etching on the p-channel side. To avoid these risks without fail, it will be preferable that the step of selective oxidation of the polycrystalline SiGe film and the gate electrode patterning step be reversed in order of sequence in the manufacture of the semiconductor device required.

Figure 21:
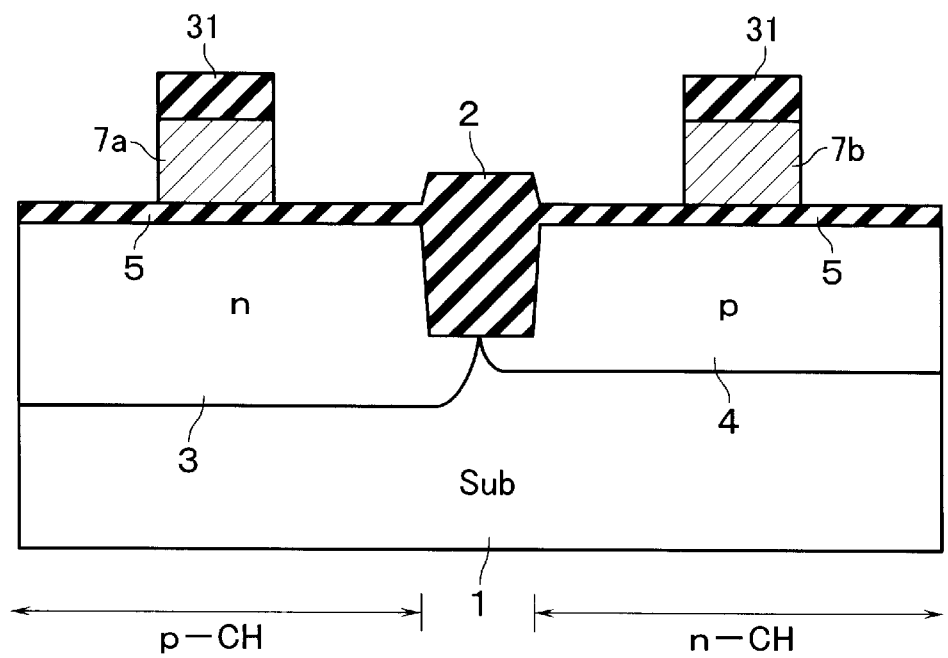
FIG. 21 is a diagram depicting, in cross-section, one major process step in the manufacture of a semiconductor device in accordance with yet another embodiment of this invention, i.e., at a gate electrode patterning step.

FIGS. 21 to 27 illustrate, in cross-section, some major steps of a fabrication process incorporating the above concept, which is an embodiment of the invention. With this embodiment also, the steps of FIGS. 8 and 9 of the previous embodiment 2 are similarly employed. After completion of the step of FIG. 9, deposit a dielectric cap film 31 on a polycrystalline SiGe film 7 as shown in FIG. 21. Then, use lithography and RIE methods to etch the dielectric cap film 31 and its underlying polycrystalline SiGe film 7, thus forming patterned gate electrodes 7a, 7b.

Figure 22:
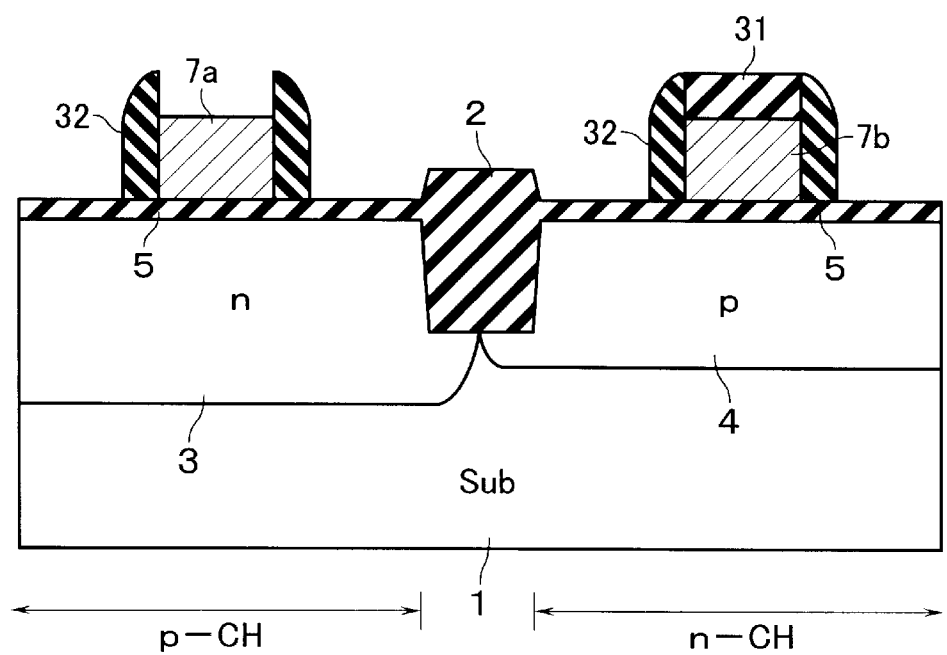
FIG. 22 is a diagram showing a sectional view at a sidewall dielectric film formation step and p-channel region's dielectric cap film removal step in the same embodiment.

Thereafter as shown in FIG. 22, form sidewall dielectric films 32 on lateral walls of the gate electrodes 7a, 7b. These sidewall dielectric films 32 are different in material from the dielectric cap film 31. Practically in this embodiment, the dielectric cap film 31 is formed of a silicon oxide film whereas the sidewall dielectric film 32 is a silicon nitride film. And, form by lithography a resist layer (not shown) covering an n-channel MISFET region n-CH; then, etch away a portion of the dielectric cap film 31 which is in the remaining, p-channel MISFET region p-CH.

Figure 23:
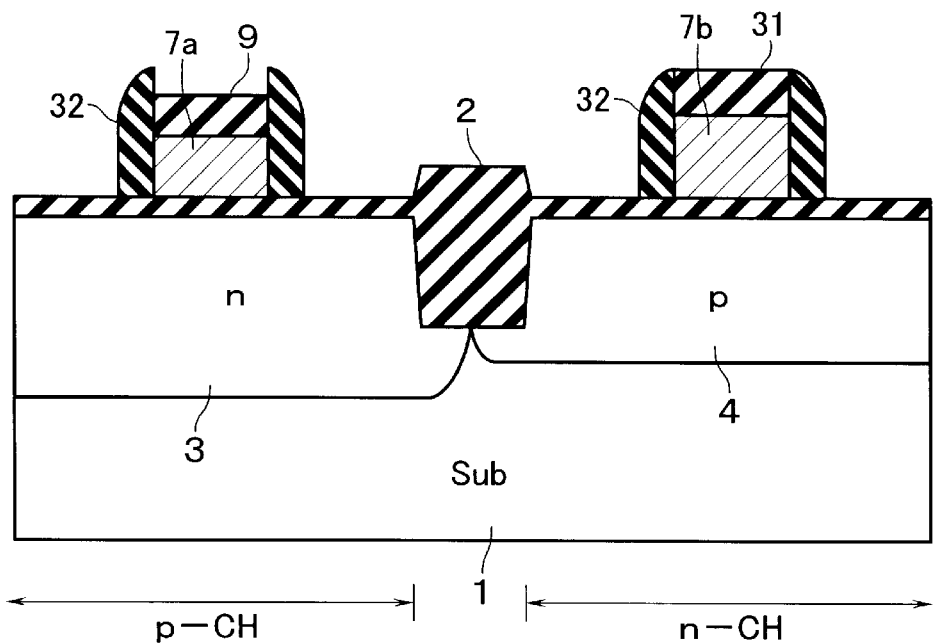
FIG. 23 is a sectional view at a polycrystalline SiGe film selective oxidation step in the embodiment.

Thereafter, selectively oxidize the polycrystalline SiGe gate electrode 7a in the exposed p-channel MISFET region p-CH under similar process conditions to those of the embodiment 1 discussed previously, thereby to form an oxide film 9 as shown in FIG. 23. Whereby, as in the previous embodiments, the polycrystalline SiGe gate electrode 7a in p-channel MISFET region p-CH is made higher in Ge concentration than the gate electrode 7b in n-channel MISFET region n-CH.

Figure 24:
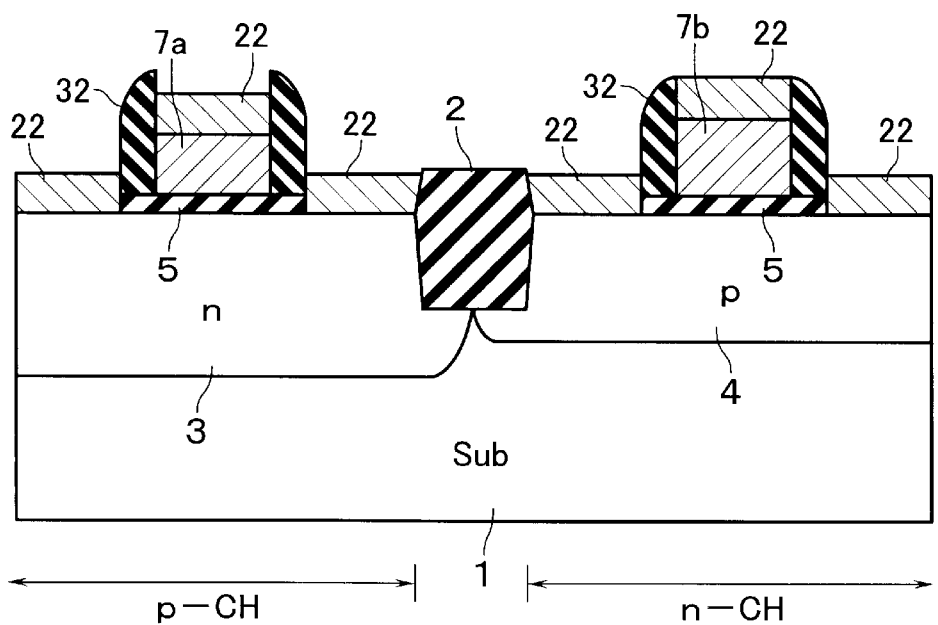
FIG. 24 shows a silicon layer selective growth step in the embodiment.
Figure 25:
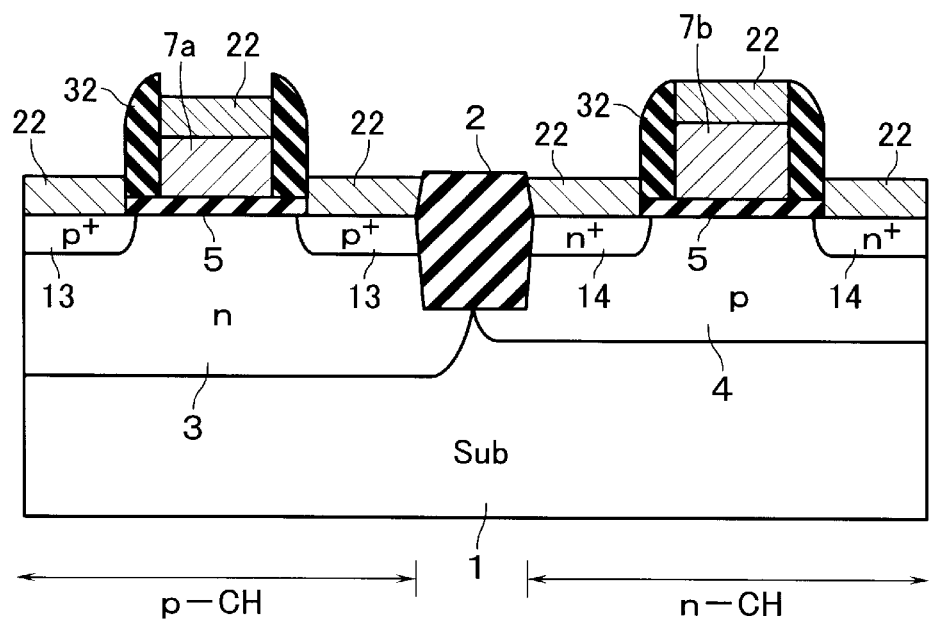
FIG. 25 shows a lightly-doped source/drain diffusion layer formation step in the embodiment.

Next, after having etched away the oxide film 9 and dielectric cap film 31 on the gate electrodes 7a, 7b along with oxide film segments overlying the source/drain regions, let a silicon layer 22 epitaxially grow selectively on the surfaces of such gate electrodes 7a–7b and source/drain regions as shown in FIG. 24. Thereafter, form source/drain diffusion layers. Preferably these source/drain diffusion layers are such that their extension regions are formed later as in the embodiment 3. More specifically as shown in FIG. 25, effectuate ion implantation of B and P or As into respective MISFET regions in the state that sidewall dielectric film components 32 are present to thereby form p$^+$-type source/drain diffusion layers 13 and n$^+$-type source/drain diffusion layers 14.

Figure 26:
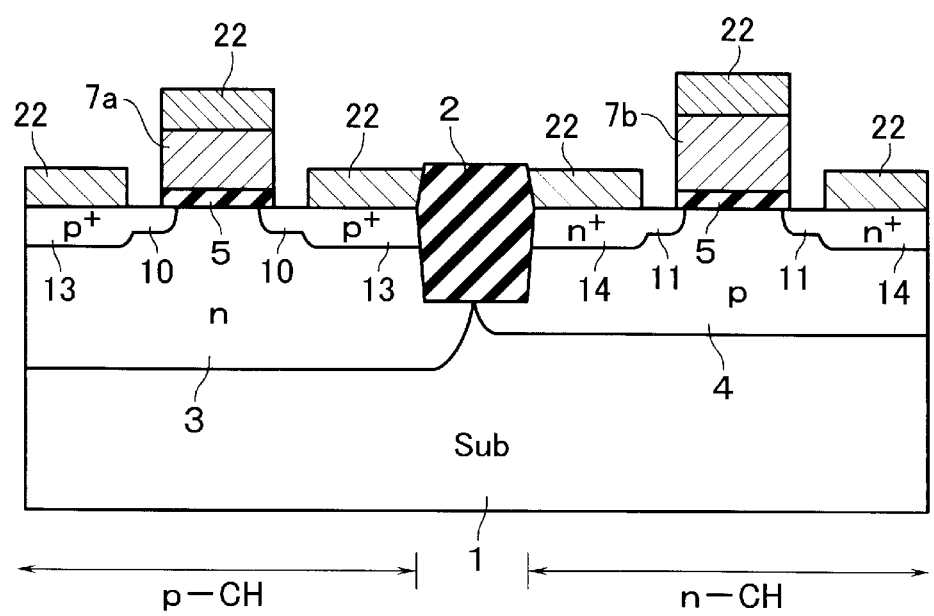
FIG. 26 shows a heavily-doped source/drain diffusion layer formation step in the embodiment.
Figure 27:
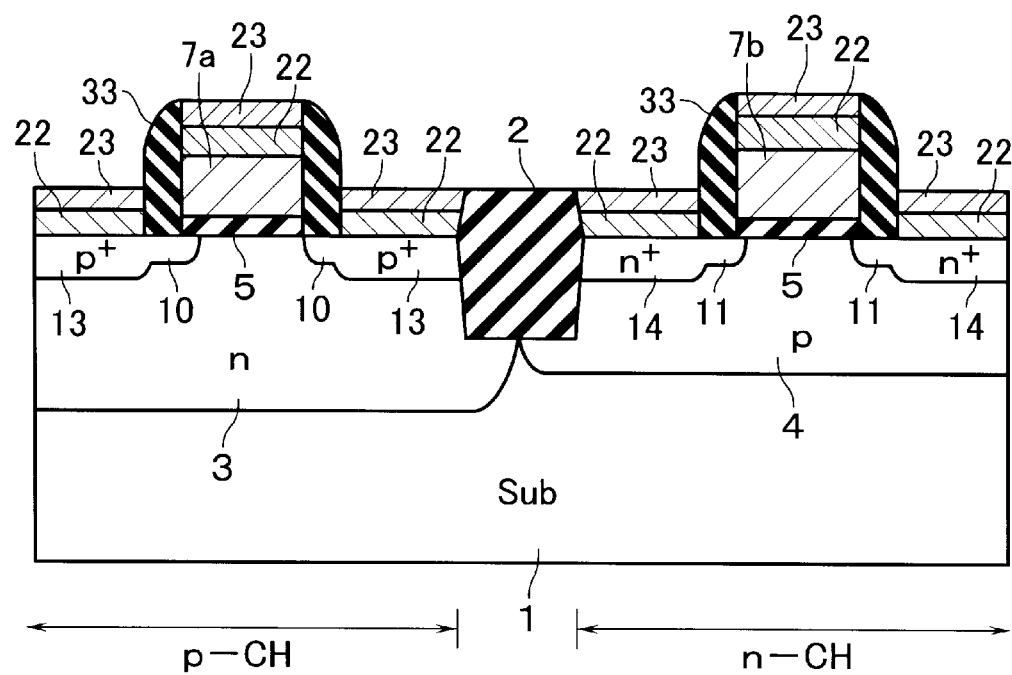
FIG. 27 shows a silicide film formation step in the embodiment.

After having etched away the sidewall dielectric films 32, perform ion implantation of B and P or As into respective MISFET regions with the gate electrodes 7a, 7b as a mask pattern, thus forming shallow lightly-doped p-type source/drain diffusion layers 10 and shallow lightly-doped n-type source/drain diffusion layers 11 as shown in FIG. 26. Then as shown in FIG. 27, again form a sidewall dielectric film 33 consisting of its portions on lateral gate walls; next, selectively form a Co silicide film 23 on the top surfaces of the gate electrodes 7a–7b and source/drain diffusion layers 13–14 through similar processes to those of the embodiment 2.

With this embodiment stated above, it is after completion of patterning of the polycrystalline SiGe gate electrodes 7a–7b that the processing is done for increasing the Ge concentration of p-channel side gate electrode 7a by selective oxidation. This avoids any possible risks of unwanted overetching and/or incomplete or "half" etching resulting in retention of non-etched portions during the gate electrode etch process.

Embodiment 5

An explanation will next be given of an embodiment drawn to an LSI device having on a chip a plurality of circuit regions different in power supply voltages from one another, which embodiment is capable of retaining increased reliability without having to form separate gate dielectric films in units of respective on-chip circuit regions. One typical approach is to control the Ge concentration of polycrystalline SiGe gate electrode in a manner such that it is different in value between two circuit regions, i.e. a circuit region of potentially high supply voltage and a low supply voltage circuit region, thereby causing both an electric field being applied to the gate dielectric film of a MISFET in one region and an electric field applied to a MISFET gate dielectric film in the other region to fall within a prespecified permissible or "allowable" range.

FIGS. 28 to 34 depict, in cross-section, some major steps in the manufacture of a semiconductor device having two different circuit regions—that is, a circuit region "L-VDD" which is low in internal power supply voltage, and another circuit region H-VDD high in internal supply voltage. When reduction to practice, each circuit region comes with CMOS circuitry as formed therein.

Figure 28:
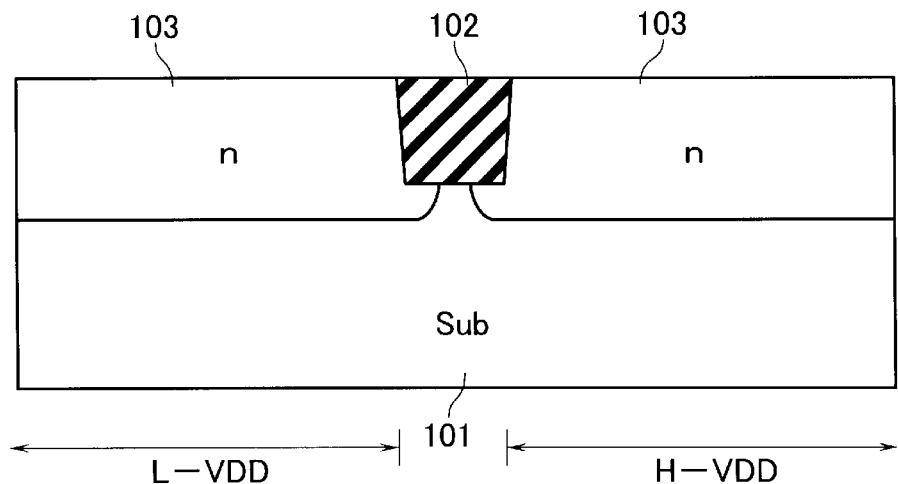
FIG. 28 is a diagram depicting, in cross-section, one major step in the manufacture of a semiconductor device in accordance with a further embodiment of this invention, which step is for element isolation and well formation processes.

As shown in FIG. 28, form in a surface portion of a silicon substrate 101 an element isolation dielectric film 102 by STI techniques. This film 102 may alternatively be formed by LOCOS methods. Thereafter, while letting silicon substrate 101 be coated with a sacrificial oxide film (not shown), perform ion implantation of a chosen impurity into the substrate to thereby form n-type well regions 103 in a p-channel MISFET region while forming p-type wells in an n-channel MISFET region, although the latter is not shown in FIG. 28 for illustration purposes only.

Figure 29:
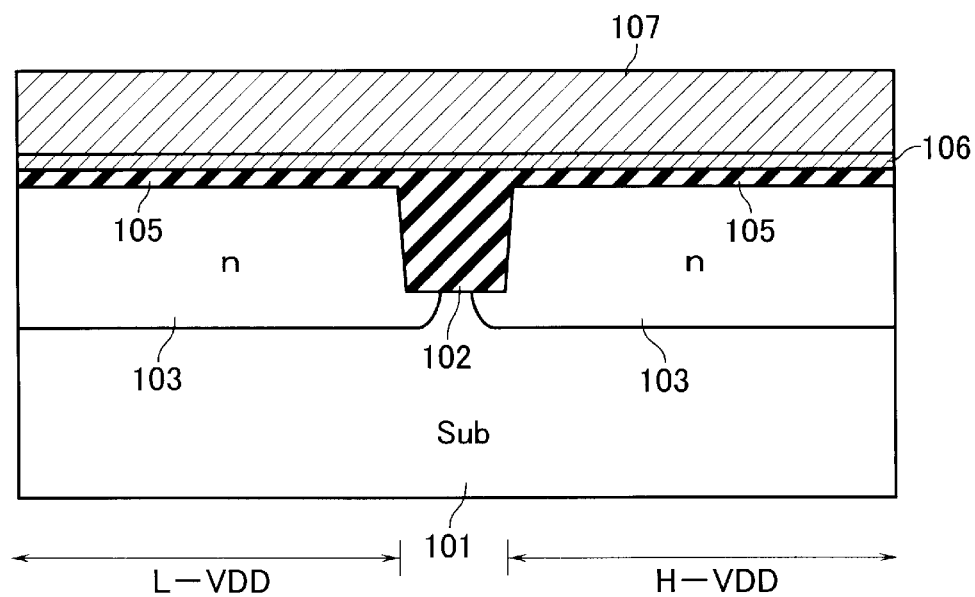
FIG. 29 depicts in cross-section a polycrystalline SiGe film deposition step in the same embodiment.

Then, after having removed off the sacrificial oxide film, form a gate dielectric film 105 to a thickness of about 2 nm as shown in FIG. 29. Note here that this thickness value is an equivalent value to its functionally corresponding silicon oxide film. Examples of the gate dielectric film 105 are a silicon oxide film formed by standard thermal oxidation, an oxynitride film formed with a thermal oxide film annealed by gaseous NO or $N_2O$, an oxynitride film obtainable by plasma nitridation of a thermal oxide film, a silicon nitride film with a thermal oxide film nitrided by $NH_3$, and a chemically vapor-deposited silicon nitride film, plus a film of metal oxides or metal silicates of Zr, Hf, Al or else.

And as shown in FIG. 29, after having formed the gate dielectric film 105, deposit a thin polysilicon film 106 to a thickness of 3 to 5 nm. Further, with this film 106 as a seed, deposit a polycrystalline SiGe film 107 to a thickness of about 200 nm. Practically the polycrystalline SiGe film 107 is formed by CVD deposition using a mixture gas of $SiH_4$ and $GeH_4$ while controlling the Ge concentration so that it ranges from 20 to 30 atm %. Although the polysilicon film 106 may be omitted in some cases, the use of it is recommendable because the presence of film 106 enables accomplishment of successful deposition with superior surface planarity.

Figure 30:
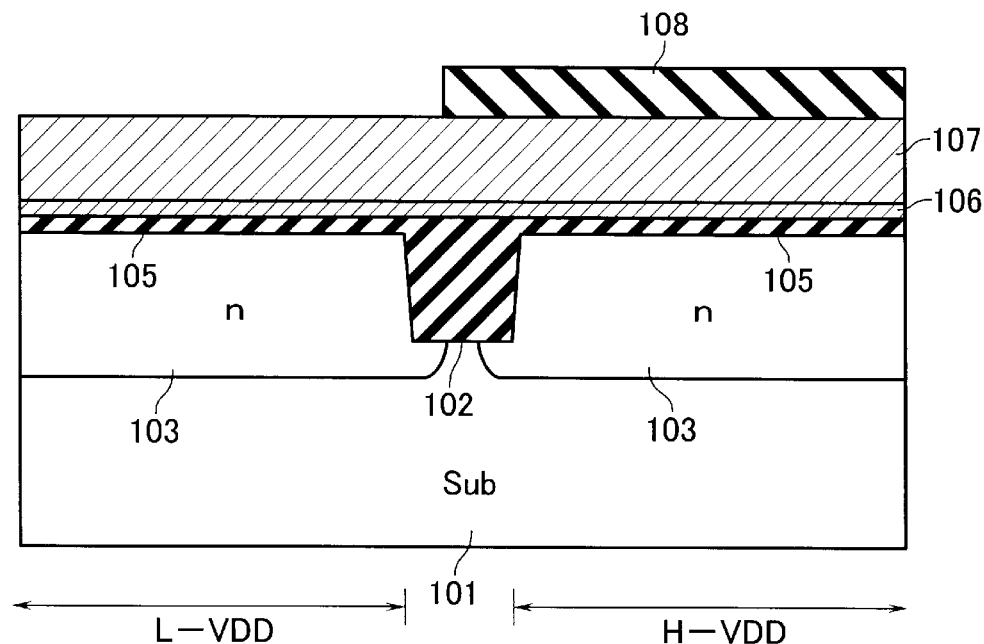
FIG. 30 is a sectional view at a polycrystalline SiGe film selective oxidation-use mask formation step in the same embodiment.

Thereafter, chemically vapor-deposit on the polycrystalline SiGe film 107 a silicon nitride film 108 to a thickness of about 10 nm. Then as shown in FIG. 30, pattern this silicon nitride film 108 through lithography and RIE processes—or alternatively, by wet etching using hot phosphoric acid—in such a manner that a film portion resides only in the high supply voltage side circuit region H-VDD.

Figure 31:
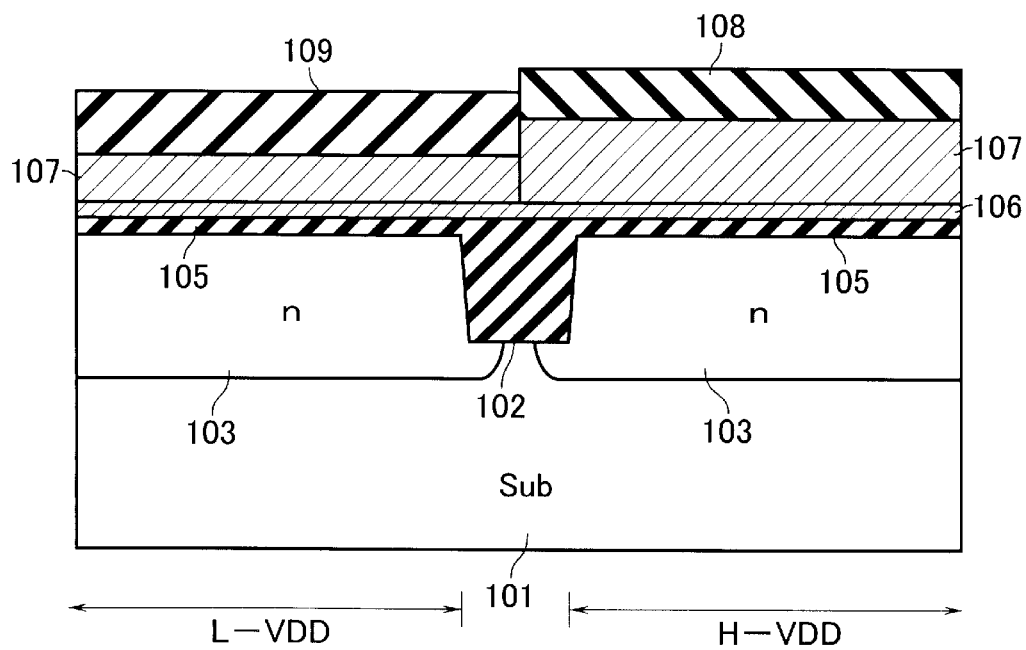
FIG. 31 is a sectional view at a polycrystalline SiGe film selective oxidation step in the embodiment.

And after having removed a resist film used, perform thermal oxidation preferably at a temperature of about 900° C., thereby forming an oxide film 109 on the exposed top surface of the polycrystalline SiGe film 107 within the low supply voltage side circuit region L-VDD as shown in FIG. 31. At this time an oxidation temperature is carefully determined to satisfy the requirement that Ge is hardly oxidized while Si alone is oxidized—practically, set at temperatures higher than or equal to 700° C. Additionally the oxidation must be done to ensure that the polycrystalline SiGe film 107 measures approximately 120 nm in its residual thickness. This thermal oxidation forces any non-oxidized Ge to diffuse into the resultant thinned polycrystalline SiGe film 107 within the circuit region L-VDD and then undergo condensation, resulting in the Ge concentration of polycrystalline SiGe film 107 becoming higher than that of the circuit region H-VDD—typically, at 30 atm % or more. Upon practical implementation, the Ge concentration is substantially equal to an initial concentration multiplied by a ratio of an initial film thickness of SiGe layer to residual film thickness. In the case of this embodiment, it is about 40 to 50 atm % or more.

Thereafter, remove by wet etching both the oxide film 109 and silicon nitride film 108. Then, use standard lithography and RIE processes to pattern the polycrystalline SiGe film 107 and polysilicon film 106, thus forming in respective circuit regions MISFET gate electrodes 107a, 107b along with an on-chip lead pattern(s) for interconnection thereto. Here, the both gate electrodes 107a–107b in respective circuit regions are patterned at a time. This simultaneous gate patterning is employable due to the fact that the SiGe layer on the film thickness-reduced side is high in Ge concentration irrespective of the presence of any film thickness differences causing the etching rate to stay lower whereby no appreciable differences take place at the termination time point of etch process. However, generally in cases where a film thickness difference is present, the length of a time period as taken up to completion of etch process becomes different accordingly—in view of this, the lithography and RIE may alternatively be done with respect to the circuit regions in a way independent of each other.

Figure 32:
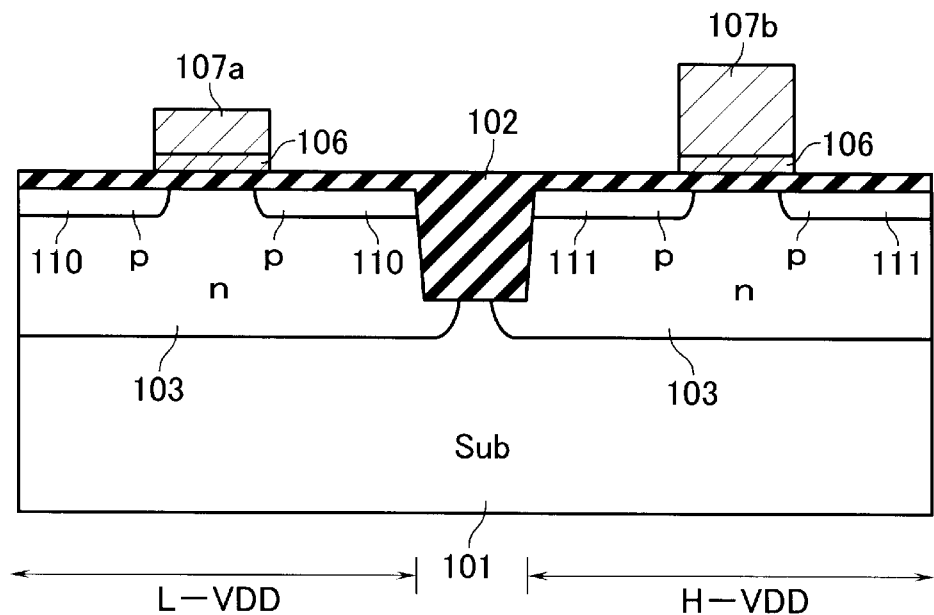
FIG. 32 shows a gate electrode patterning step and lightly-doped source/drain diffusion layer formation step in the embodiment.

Thereafter as shown in FIG. 32, after having formed a post oxidation film (not shown) with a thickness of about 2 nm, let each p-channel MISFET region be doped with boron (B) by ion implantation with the gate electrodes 107a, 107b as a mask, thereby forming shallow lightly-doped p-type source/drain diffusion layers 110, 111. Implant arsenide (As) ions into n-channel MISFET region to thereby form thick lightly-doped n-type source/drain diffusion layers (not shown). After having formed these diffusion layers, perform thermal processing such as RTA or else to thereby activate the doped impurities or dopants.

Figure 33:
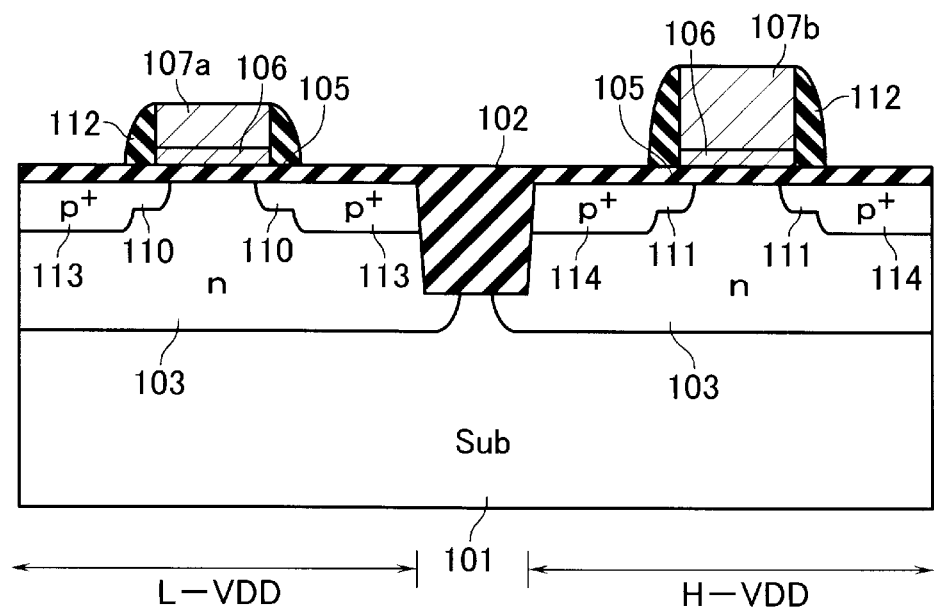
FIG. 33 shows a sidewall dielectric film formation step and heavily-doped source/drain diffusion layer forming step in the embodiment.

Next, deposit a multilayer film which consists essentially of a silicon oxide film (with a thickness of 5 nm) and a silicon nitride film (15-nm thick) and then apply thereto RIE etchback treatment, thus forming sidewall dielectric films 112 on the lateral walls of respective gate electrodes 107a, 107b as shown in FIG. 33. Then, with both the gate electrodes 107a–107b and the sidewall dielectric films 112 as a mask structure, perform ion-implantation of boron (B) and arsenide (As) or phosphorus (P) sequentially into respective MISFET regions to thereby form deep heavily-doped p ($p^+$) type source/drain diffusion layers 113, 114 and deep heavily-doped n ($n^+$) type source/drain diffusion layers (not shown). The diffusion layers 113–114 are greater both in depth and in impurity concentration than the above-noted layers 110–111. At this time boron is also doped into the gate electrode 107a, 107b of each p-channel MISFET region. After having formed these diffusion layers, perform thermal processing such as RTA or else, thus activating the impurities doped.

Figure 34:
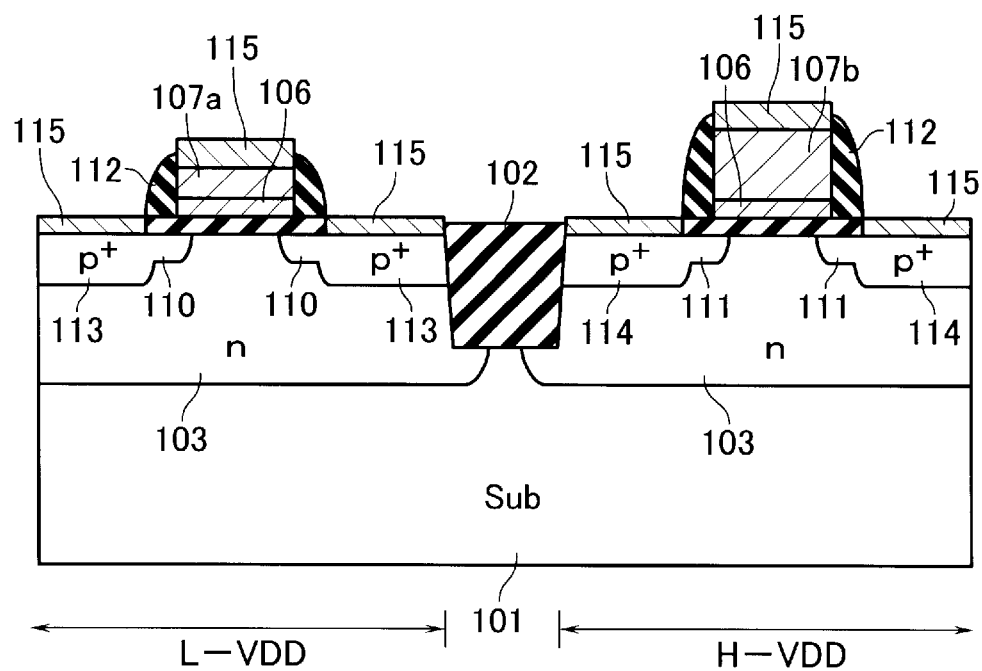
FIG. 34 shows a silicide film forming step in the embodiment.
Figure 35:
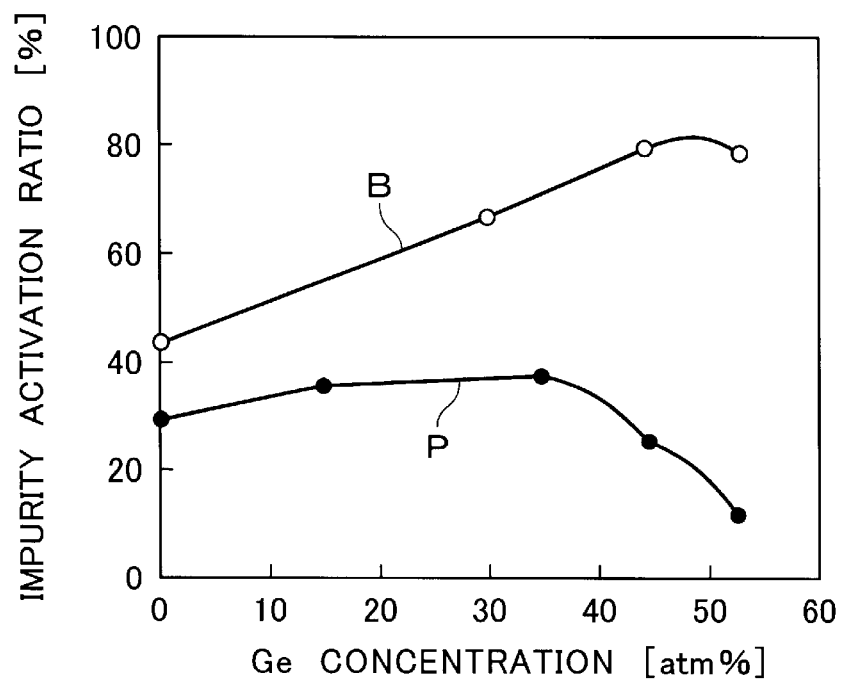
FIG. 35 is a graph showing a relationship of Ge concentration of polycrystalline SiGe material and impurity activation ratio.

After having removed by wet etching any residual oxide film components on or above surfaces of the gate electrodes 107a–107b and source/drain diffusion layers 113–114, fabricate a Ni film by sputtering. Then execute thermal processing at about 400° C. for 20 seconds, thereby forming a Ni silicide film 115 that has its portions residing on the top surfaces of gate electrodes 107a-b and source/drain diffusion layers 113–114 as shown in FIG. 34.

Thereafter, deposit more than one ILD film for formation of a pattern of on-chip metal leads, although not specifically depicted here.

With this embodiment also, it is possible to optimize the impurity activation ratio of polycrystalline SiGe film-based gate electrodes in a way conformity with the circuit regions. More specifically, with this embodiment, effectuation of selective oxidation of the SiGe gate electrodes results in the MISFET gate electrode 107a of the low voltage side circuit region L-VDD being higher in Ge concentration than the MISFET gate electrode 107b in the high voltage side circuit region H-VDD. This in turn makes it possible to equalize electric fields being applied to the both MISFETs irrespective of the fact that the gate dielectric films 105 thereof are the same in physical film thickness as each other and yet different in supply voltage from each other.

Figure 36:
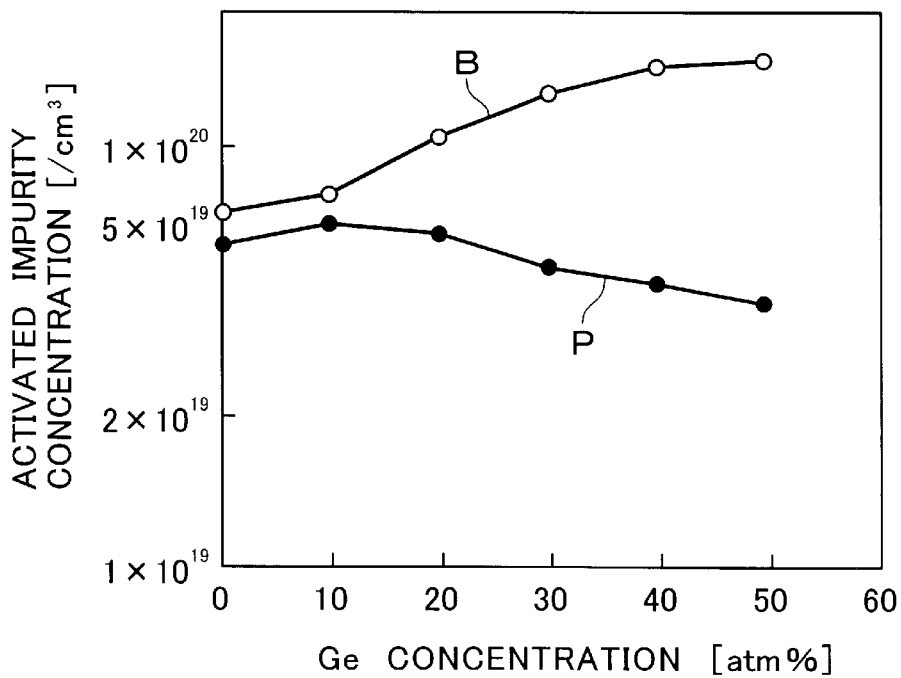
FIG. 36 is a graph showing a relation of Ge concentration of polycrystalline SiGe and activated impurity concentration.
Figure 37:
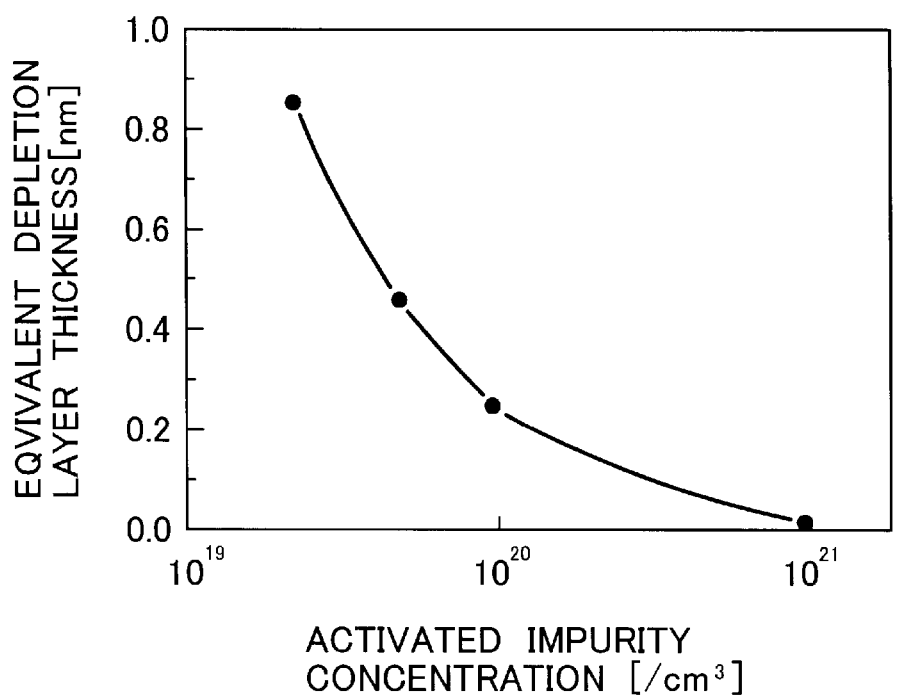
FIG. 37 is a graph showing a relation of activated impurity concentration of polycrystalline SiGe gate electrode versus depletion ratio.

More specifically, as shown in FIG. 36, in the case of boron for use as a p-type impurity, an activated impurity concentration measured at a Ge concentration of 20 to 30% noticeably gets higher in value than that at a Ge concentration of 40–50%. As better shown in FIG. 37, the higher the activated impurity concentration, the smaller the thickness of a depletion layer of SiGe film; thus, the larger the capacitance of such depletion layer. In view of the fact that the capacitance of a gate electrode portion is represented by a series combination of a gate dielectric film capacitance and a substrate surface capacitance plus a capacitance of deletion layer of gate electrode, if the same power supply voltage is employed then a voltage being applied to a gate dielectric film increases with a decrease in thickness of such gate electrode's depletion layer. In the case of this embodiment, two p-channel MISFETs are different in supply voltage from each other; however, any difference of gate depletion layer capacitance serves to reduce a difference between electric fields being applied to the gate dielectric films of the both transistors. In short, lowering the Ge concentration of the high supply voltage-side gate electrode 107b while making higher the Ge concentration of low supply voltage side gate electrode 107a makes it possible to permit the electric fields being applied to the both gate dielectric films to stay substantially identical in value to each other.

And in accordance with this embodiment, unlike the prior art, it does not utilize any process for forming separate gate dielectric films in units of circuit regions. As a consequence, there is no appreciable reliability reduction otherwise occurring due to contamination during lithography processing of the gate dielectric films involved while simultaneously enhancing or maximizing gate dielectric film thickness controllability.

In the embodiment 5, let the Ge concentration of SiGe gate electrode of a circuit region of different internal power supply voltage be made different in a way conformity with the fabrication process of the embodiment 1. This will be effective in cases where the metal silicide film is made of Ni silicides. In case the metal silicide film is made of Co silicides, an extra step is required of performing selective growth of a silicon layer on the gate electrode and source/drain diffusion layers. Accordingly, the process of the embodiment 2, 3 may be employed.

It has been stated that in accordance with this invention, it is possible to optimize the impurity activation ratio of each gate electrode by differentiating the Ge concentration of a polycrystalline SiGe film for use as such gate electrode in a way pursuant to on-chip circuit regions.

While the present invention has been particularly shown and described with reference to the embodiments, it will be understood by those skilled in the art that various changes in form and detail may be made without departing from the spirit, scope, and teaching of the invention.

What is claimed is:

1. A semiconductor device comprising:
   a semiconductor substrate;
   a first transistor having a first gate electrode overlying said semiconductor substrate and being formed of a polycrystalline silicon germanium film; and
   a second transistor having a second gate electrode overlying said semiconductor substrate and being formed of a polycrystalline silicon germanium film different in germanium concentration from said first gate electrode;
   wherein said first and second transistors are of a p-channel type; and
   wherein said second transistor is formed in a circuit region with a voltage lower than that of said first transistor being applied thereto, and wherein the germanium concentration of said second gate electrode is set higher than that of said first gate electrode.

2. The semiconductor device according to claim 1, wherein the first and second gate electrodes are formed through patterning of an identical polycrystalline silicon germanium film while causing said second gate electrode to increase in germanium concentration by selective oxidation.

3. The semiconductor device according to claim 1, wherein the germanium concentration of said first gate electrode is set to range from 20 to 30 atomic percent ("atm %") whereas the germanium concentration of said second gate electrode is set to be greater than or equal to 30 atm %.

4. The semiconductor device according to claim 1, wherein the germanium concentration of said first gate electrode is set to range from 20 to 30 atm % whereas the germanium concentration of said second gate electrode is set to measure 40 to 50 atm %.

5. The semiconductor device according to claim 1, wherein the first and second transistors have gate dielectric films being the same in thickness as each other.

* * * * *